United States Patent
Kong et al.

(10) Patent No.: US 10,714,569 B1
(45) Date of Patent: Jul. 14, 2020

(54) PRODUCING STRAINED NANOSHEET FIELD EFFECT TRANSISTORS USING A PHASE CHANGE MATERIAL

(71) Applicant: International Business Machines Corporation, Armonk, NY (US)

(72) Inventors: Dexin Kong, Guilderland, NY (US); Kangguo Cheng, Schenectady, NY (US); Juntao Li, Cohoes, NY (US); Zhenxing Bi, Niskayuna, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/366,671

(22) Filed: Mar. 27, 2019

(51) Int. Cl.
| | |
|---|---|
| *H01L 29/06* | (2006.01) |
| *H01L 29/66* | (2006.01) |
| *H01L 29/16* | (2006.01) |
| *H01L 21/02* | (2006.01) |
| *H01L 29/78* | (2006.01) |

(Continued)

(52) U.S. Cl.
CPC .... *H01L 29/0673* (2013.01); *H01L 21/02532* (2013.01); *H01L 21/823807* (2013.01); *H01L 21/823821* (2013.01); *H01L 21/823828* (2013.01); *H01L 27/0924* (2013.01); *H01L 29/16* (2013.01); *H01L 29/6681* (2013.01); *H01L 29/66545* (2013.01); *H01L 29/785* (2013.01); *H01L 29/7849* (2013.01)

(58) Field of Classification Search
CPC ................ H01L 29/0669–068; H01L 29/7849
See application file for complete search history.

(56) References Cited

U.S. PATENT DOCUMENTS

| | | |
|---|---|---|
| 8,399,314 B2 | 3/2013 | Cohen et al. |
| 8,492,208 B1 | 7/2013 | Cohen et al. |
| 9,287,357 B2 | 3/2016 | Rodder et al. |

(Continued)

OTHER PUBLICATIONS

Ding, et al. "Phase Change Liner Stressor for Strain Engineering of P-Channel FinFETs," IEEE Transactions on Electron Devices, vol. 60, No. 9, Sep. 2013, 9 pages.

(Continued)

*Primary Examiner* — Daniel P Shook
(74) *Attorney, Agent, or Firm* — Amin, Turocy & Watson, LLP

(57) ABSTRACT

Strained nanosheet field effect transistors (FETs) using a phase change material are described herein. In some embodiments, a semiconductor device can comprise alternating layers of a channel material and a phase change material to produce strained nanosheet field effect transistors, wherein the layers of the phase change material cause a strain in the layers of the channel material. The phase change material comprises germanium antimony telluride. The germanium antimony telluride crystallizes into a crystalline germanium antimony telluride based on annealing above 300 degrees Celsius and a volume of the crystalline germanium antimony telluride is reduced up to six percent relative to an initial volume the germanium antimony telluride to cause the strain in the layers of the channel material. The semiconductor device can also comprise source and drain epitaxial growths on both ends of the layers of the channel material that lock the strain in the layers of the channel material.

20 Claims, 20 Drawing Sheets

(51) Int. Cl.
    *H01L 21/8238*     (2006.01)
    *H01L 27/092*     (2006.01)

(56) References Cited

U.S. PATENT DOCUMENTS

| | | |
|---|---|---|
| 9,711,414 B2 | 7/2017 | Hatcher et al. |
| 9,735,269 B1 | 8/2017 | Cheng et al. |
| 9,871,140 B1 | 1/2018 | Balakrishnan et al. |
| 2015/0187762 A1* | 7/2015 | Wahl .................... H01L 27/088 257/9 |
| 2015/0295084 A1 | 10/2015 | Obradovic et al. |
| 2015/0380552 A1 | 12/2015 | Tu et al. |
| 2016/0111337 A1 | 4/2016 | Hatcher et al. |
| 2017/0040455 A1 | 2/2017 | Kittl et al. |
| 2017/0323953 A1 | 11/2017 | Cheng et al. |

OTHER PUBLICATIONS

Do, et al., "TEM Study on Volume Changes and Void Formation in Ge2Sb2 Te5 Films, with Repeated Phase Changes," Electrochemical and Solid-State Letters, 13 (8) H284-H286 (2010), 3 pages.

* cited by examiner

PRODUCING STRAINED NANOSHEET FIELD EFFECT TRANSISTORS USING A PHASE CHANGE MATERIAL

BACKGROUND

The subject disclosure relates to semiconductor devices, more specifically, strained nanosheet field effect transistors (FETs) using a phase change material.

SUMMARY

The following presents a summary to provide a basic understanding of one or more embodiments of the invention. This summary is not intended to identify key or critical elements, or delineate any scope of the particular embodiments or any scope of the claims. Its sole purpose is to present concepts in a simplified form as a prelude to the more detailed description that is presented later. In one or more embodiments herein, devices and/or methods that facilitate producing strained nanosheet FETs using alternating layers of a phase change material are provided.

According to one embodiment, a semiconductor device is provided. The semiconductor device can comprise alternating layers of a channel material and a phase change material, wherein the layers of the phase change material cause a strain in the layers of the channel material to produce strained nanosheet field effect transistors.

According to another embodiment, a method is provided. The method can comprise forming alternating layers of a channel material and a phase change material, wherein the layers of the phase change material cause a strain the layers of the channel material to produce strained nanosheet field effect transistors.

According to another embodiment, a semiconductor device is provided. The semiconductor device can comprise alternating layers of a channel material and a phase change material, wherein the layers of the phase change material cause a strain in the layers of the channel material to produce strained nanosheet field effect transistors, and wherein the phase change material comprises germanium antimony telluride.

DETAILED DESCRIPTION

Figure 1:
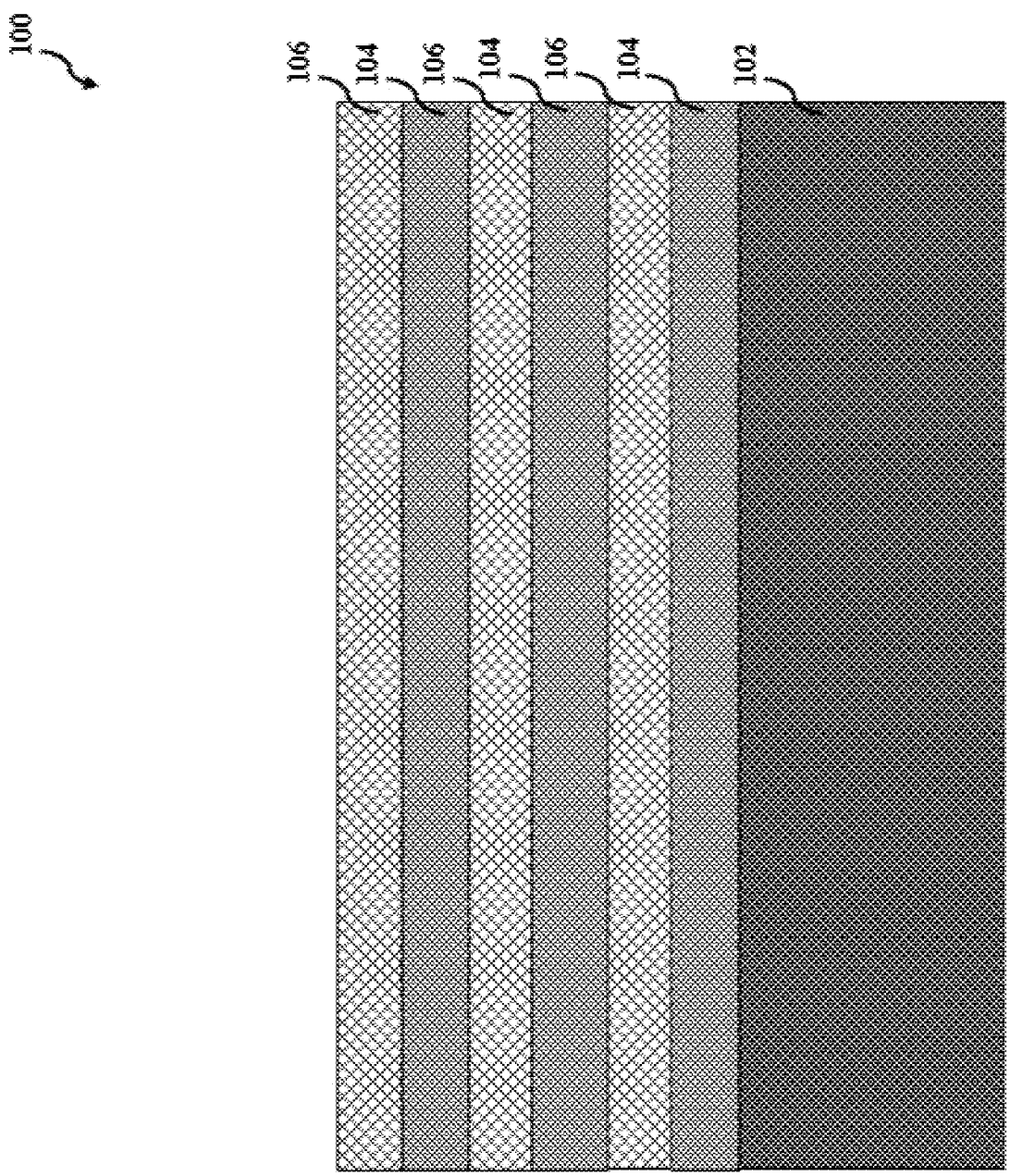
FIG. 1 illustrates a semiconductor device facilitating producing strained nanosheet FETs using alternating layers of a phase change material including a film stack of alternating layers of semiconductor material on a substrate in accordance with one or more embodiments described herein.

The following detailed description is merely illustrative and is not intended to limit embodiments and/or application or uses of embodiments. Furthermore, there is no intention to be bound by any expressed or implied information presented in the preceding Background or Summary sections, or in the Detailed Description section.

One or more embodiments are now described with reference to the drawings, wherein like referenced numerals are used to refer to like elements throughout. In the following description, for purposes of explanation, numerous specific details are set forth in order to provide a more thorough understanding of the one or more embodiments. It is evident, however, in various cases, that the one or more embodiments can be practiced without these specific details.

Nanosheets can be pursued as one of the main paths to further scale complementary metal oxide semiconductor field effect transistors (CMOS FETs), e.g., generally, FETs. Posing a proper strain in a FET can enhance carrier mobility and thereby improve performance of the FET. However, it can be a challenge to have stacked nanosheet channels strained in a CMOS device in order to increase carrier mobility.

Nanosheets are described herein, however, it can be appreciated that nanowires can be employed with equal effect. Additionally, a compressive strain is described herein as being introduced in the pFET region in which the carriers for conducting electric current are holes, however, it can be appreciated that a tensile strain can be introduced in the nFET region in which the carriers for conducting electric current are electrons. Although germanium antimony telluride (GST) is described herein as an example to produce a compressive strain in the stacked nanosheet channels of the pFET region, it can be appreciated that the masking and patterning techniques described herein can be applied to the nFET region. For example, hydrogen doped silicon nitride can be used to produce a tensile strain in the nFET region. The hydrogen doped silicon nitride can be deposited by plasma enhanced chemical vapor deposition (PECVD) and an ultraviolet (UV) cure can be applied to produce a tensile strain in the stacked nanosheet channels of the nFET region. To produce different strains in different types of FETs, for example, compressive strain for the pFET region and tensile strain for nFET region, respectively, on the same chip or CMOS device, the materials and/or processes described above can be used in conjunction with the masking and patterning techniques described herein.

A semiconductor device can comprise alternating layers of a channel material and a phase change material, wherein the layers of the phase change material can cause a strain in the layers of the channel material. The semiconductor device can further comprise alternating layers of the channel material and a sacrificial channel material, wherein the layers of the phase change material can replace the layers of the sacrificial channel material to introduce the strain in the layers of the channel material. In exemplary embodiments, the channel material can comprise silicon, and wherein a channel comprising the channel material can be a silicon channel. In another exemplary embodiment, the sacrificial channel material can comprise silicon germanium. The phase change material can comprise GST for the pFET region to produce a compressive strain, or the phase change material can be hydrogen doped silicon nitride for the nFET region to produce a tensile strain. The GST material as deposited can be in an amorphous phase. Annealing at above a certain temperature (e.g., above 300 degrees Celsius (>300° C.)) can cause the GST to crystallize resulting in a volume reduction up to six percent (~6%). For the hydrogen doped silicon nitride, a UV cure can be applied to produce the tensile strain. The semiconductor device can further comprise source and drain epitaxial growths that can lock the strain in the layers of the channel material based on location of the source and drain epitaxial growths on both ends of the layers of the channel material. The source and drain epitaxial growths can maintain the strain in the layers of the channel material after removal of the layers of the phase change material. The strain can be a compressive strain on the layers of the channel material in the pFET region or the strain can be a tensile strain on the layers of the channel material in the nFET region. Additionally, the layers of the sacrificial channel material can be replaced with the layers of the phase change material before a sacrificial gate deposition over the alternating layers of the channel material and the phase change material or after the sacrificial gate deposition over the alternating layers of the channel material and the sacrificial channel material.

More specifically, the embodiments described herein propose producing a compressive strain for the stacked nanosheet channels using a phase change material, for example, GST or amorphous germanium antimony telluride (a-GST). During anneal at above a certain temperature (e.g., >300° C.), a-GST can become crystallized and transform into a crystalline (e.g., c-GST), which can result in a volume reduction up to six percent (~6%). A compressive strain can be introduced in the stacked nanosheet channels by placing a-GST and annealing to cause a phase transition of the a-GST to c-GST. The compressive strain can be maintained at after c-GST removal and addition of an RMG because the source and drain epitaxial growths at the ends of the stacked nanosheet channels can lock the compressive strain in the stacked nanosheet channels.

FIG. 1 illustrates a semiconductor device 100 facilitating producing strained nanosheet FETs using alternating layers of a phase change material including a film stack of alternating layers of semiconductor material on a substrate 102 in accordance with one or more embodiments described herein. The substrate 102 can be a silicon-containing semiconductor material. Illustrative examples of silicon-containing materials suitable for the substrate 102 (e.g., a bulk-semiconductor substrate or a bulk substrate) can include, but are not limited to, silicon, silicon germanium, silicon germanium carbide, silicon carbide, polysilicon, epitaxial silicon, and multi-layers thereof. Although silicon can be the predominantly used semiconductor material in wafer fabrication, alternative semiconductor materials can be employed, such as, but are not limited to, germanium, gallium arsenide, gallium nitride, silicon germanium, cadmium telluride, and zinc selenide. In preferred embodiments, the substrate 102 can comprise silicon.

Although not illustrated, it can be appreciated that the substrate 102 can be a silicon on insulator (SOI) substrate having a layer of semiconductor material as described above, a layer of insulator over the layer of semiconductor, and another layer of semiconductor material being a sacrificial channel material layer 104 as described below. It can be contemplated that the insulator layer can be formed from silicon dioxide, but it can be understood that any appropriate dielectric material can be used. A dielectric material can be low-k (e.g., having a dielectric constant k that can be lower than that of silicon dioxide) or high-k (e.g., having a dielectric constant k that can be higher than that of silicon dioxide). Exemplary alternative low-k dielectrics can include carbon-doped silicon oxide, carbon-doped oxide, and undoped silicon glass. Exemplary alternative high-k dielectrics can include hafnium oxide, hafnium silicate, titanium oxide, barium strontium titantate, and lead zirconate titantate.

The film stack of alternating layers of semiconductor material (e.g., nanosheets) can comprise the sacrificial channel material layer 104 and a channel material layer 106. The sacrificial channel material layer 104 can be the first layer in the film stack of alternating layers of semiconductor material. Although in preferred embodiments the sacrificial channel material layer 104 can be formed from silicon germanium and the channel material layer 106 can be formed from silicon (e.g., stacked nanosheet channels), it can be appreciated that any appropriate materials can be used instead, as long as the two semiconductor materials have etch selectivity with respect to one another. As used herein, the term "selective" or "selectivity" in reference to a material removal process can denote that the rate of material removal for a first material can be greater than the rate of removal for at least another material of the structure to which the material removal process is being applied. It can be appreciated that the channel material layer 106 can include any suitable semiconductor material such as, for example, silicon, germanium, silicon germanium, and/or a III-V semiconductor. Non-limiting thickness of sacrificial channel material layer 104 can range from 6 nanometer (nm) to 20 nm, and non-limiting thickness of channel material layer 106 can range from 5 nm to 15 nm.

The sacrificial channel material layer 104 and the channel material layer 106 can be deposited by any appropriate mechanism. It can be specifically contemplated that the sacrificial channel material layer 104 and the channel material layer 106 can be epitaxially grown from one another, but alternate deposition processes, such as chemical vapor deposition (CVD), physical vapor deposition (PVD), atomic layer deposition (ALD), or gas cluster ion beam (GCIB) deposition, can also be contemplated.

CVD can be a deposition process in which a deposited species can be formed as a result of chemical reaction between gaseous reactants at greater than room temperature (e.g., from about 25° C. to about 900° C.). The solid product of the reaction can be deposited on the surface on which a film, coating, or layer of which the solid product is to be formed. Variations of CVD processes can include, but are not limited to, atmospheric pressure chemical vapor deposition (APCVD), low pressure chemical vapor deposition (LPCVD), PECVD, metal-organic chemical vapor deposition (MOCVD), and combinations thereof. In alternative embodiments that use PVD, a sputtering apparatus can include direct-current diode systems, radio frequency sputtering, magnetron sputtering, or ionized metal plasma sputtering. In alternative embodiments that use ALD, chemical precursors can react with the surface of a material one at a time to deposit a thin film on the surface. In alternative embodiments that use GCIB deposition, a high-pressure gas can be allowed to expand in a vacuum, subsequently condensing into clusters. The clusters can be ionized and directed onto a surface, providing a highly anisotropic deposition.

Figure 2:
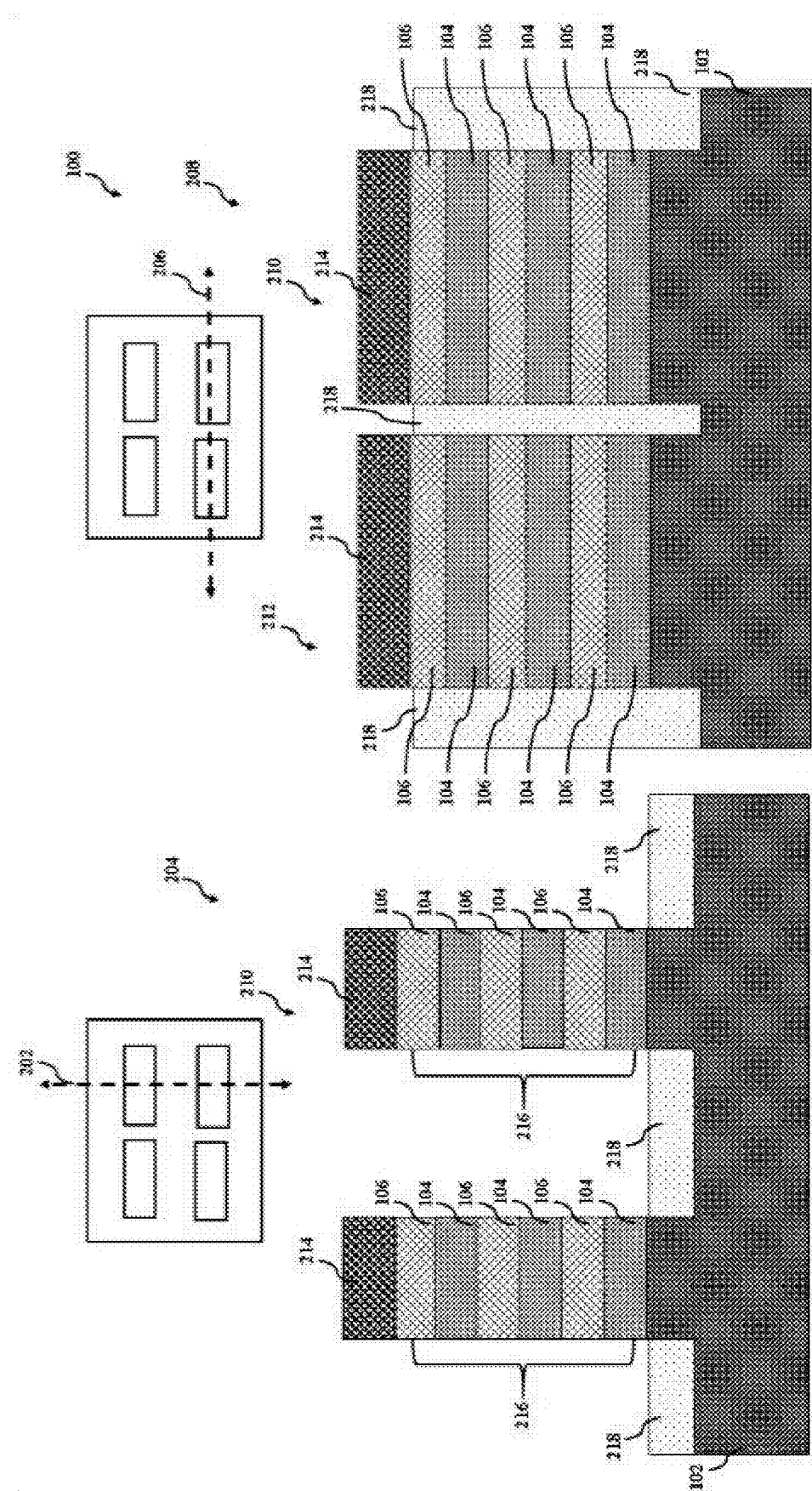
FIG. 2 illustrates a semiconductor device of FIG. 1 facilitating producing strained nanosheet FETs using alternating layers of a phase change material including fins and a dielectric fill in accordance with one or more embodiments described herein.

FIG. 2 illustrates a semiconductor device 100 of FIG. 1 facilitating producing strained nanosheet FETs using alternating layers of a phase change material including fins 216 and a dielectric fill 218 in accordance with one or more embodiments described herein. As provided herein, the fins 216 can be illustrated with different cross-sectional views. A cross-sectional line 202 can depict the location of a cross-sectional view corresponding to the cross-section 204. A cross-sectional line 206 can depict the location of a cross-sectional view corresponding to the cross-section 208. The cross-sectional line 202 can cross through a pFET region 210. The cross-sectional line 206 can cross through the pFET region 210 and the nFET region 212.

Hardmasks 214 can be deposited on alternating layers of semiconductor materials to facilitate the formation of patterning alternative layers of semiconductor materials to form fins 216. The hardmasks 214 can be used to define fin regions, with material not covered by the hardmasks 214 being etched away, producing the fins 216. It can be contemplated that this etch can be performed as part of a shallow trench isolation (STI) process. However, it is appreciated that other forms of anisotropic etching can be employed instead. Other examples of anisotropic etching that can be used can include ion beam etching, plasma etching, or laser ablation. Alternatively, the fins 216 can be formed by any suitable patterning technique, including but not limited to, lithography followed by etching, sidewall image transfer (SIT), self-aligned double patterning (SADP), self-aligned multiple patterning (SAMP), self-aligned quadruple patterning (SAQP), etc. In preferred embodiments, the STI process can be used. STI regions can be formed by etching a trench through the film stack of alternating layers of semiconductor material and the substrate 102 utilizing a conventional dry etching process such as reactive ion etching (RIE) or plasma etching. A dielectric material such as an oxide but not limited to silicon dioxide can be deposited in the trench to form the dielectric fill 218. The dielectric fill 218 can be formed using a flowable chemical vapor deposition (FCVD). Excess dielectric material can be removed using a technique such as chemical-mechanical planarization (CMP).

The cross-section 204 illustrates that the dielectric fill 218 can have a determined thickness about the depth of the etched portions of the substrate 102. As illustrated in cross-section 204, the dielectric fill 218 can have a height below the first sacrificial channel material layer 104. The cross-section 208 illustrates that the dielectric fill 218 can have a determined thickness about the depth of the etched trenches below the hardmasks 214. As illustrated in cross section 208, the dielectric fill can have a height that can cover the fins 216 and below the hardmasks 214.

While it can be contemplated that the hardmasks 214 can be formed from silicon nitride, it can be appreciated that alternative hardmask materials can include silicon oxides, silicon oxynitrides, silicon carbides, silicon carbonitrides, etc. The width of the hardmasks 214 can define the width of the fins 216. In particular, controlling the width of the hardmasks 214 can determine whether the fins 214 form nanowires or nanosheets. It can be appreciated that nanowires have a width-to-thickness ratio that is about 2:1 or less, while nanosheets have a width-to-thickness ratio that is about 2:1 or greater.

Figure 3:
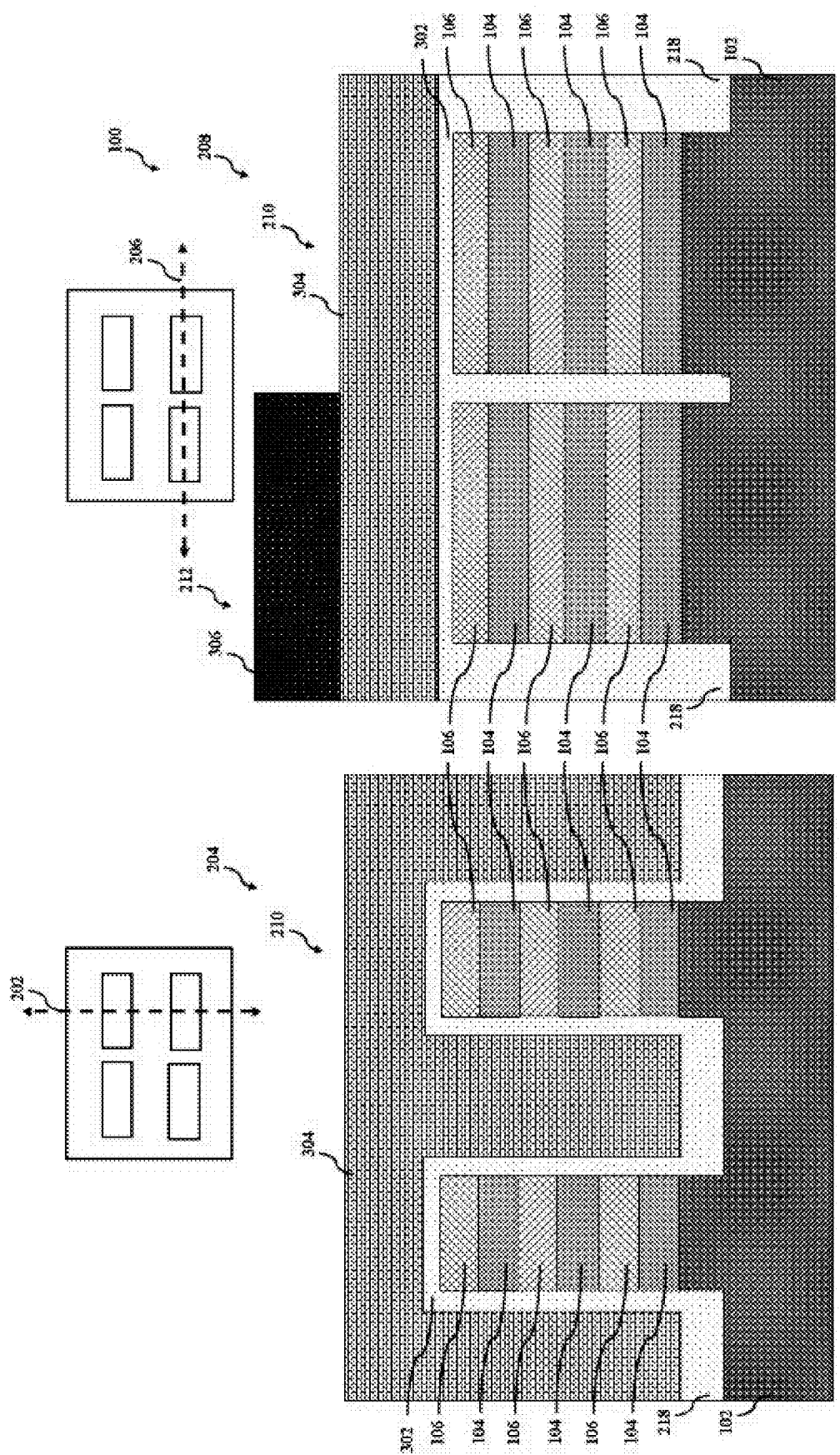
FIG. 3 illustrates a semiconductor device of FIG. 2 facilitating producing strained nanosheet FETs using alternating layers of a phase change material including a dielectric layer around the fins and a sacrificial gate over the fins in accordance with one or more embodiments described herein.

FIG. 3 illustrates a semiconductor device 100 of FIG. 2 facilitating producing strained nanosheet FETs using alternating layers of a phase change material including a dielectric layer 302 around the fins 216 and a sacrificial gate material layer 304 around the fins 216 in accordance with one or more embodiments described herein. The hardmasks 214 can be removed to form a dielectric layer 302 over the fins 214. The dielectric layer 302 can be formed using conformal oxide deposition to coat a layer around the fins 216. The conformal oxide deposition can be, but is not limited to, ALD or CVD, to deposit a thin film on the surface of the fins 216 until a determined thickness is reached. The dielectric layer 302 can be formed from any appropriate dielectric material. In preferred embodiments, the dielectric layer 302 can be an oxide such as silicon dioxide.

The sacrificial gate material layer 304 can be formed on the dielectric layer 302 over the fins 216. As illustrated in cross-section 204, the sacrificial gate material layer 304 can also be formed on the dielectric fill 218 to a height over the fins 216. The sacrificial gate material layer 304 can be formed from an amorphous silicon and CMP can be used to polish the sacrificial gate 304 down to a determined thickness. A block 306 can be patterned on the sacrificial gate material layer 304 over the nFET region 212 to protect the nFET region 212 for additional processes as described below. The block 306 can be a photolithography mask such as, for example, an optical planarization layer (OPL) used to block some regions from processes.

Figure 4:
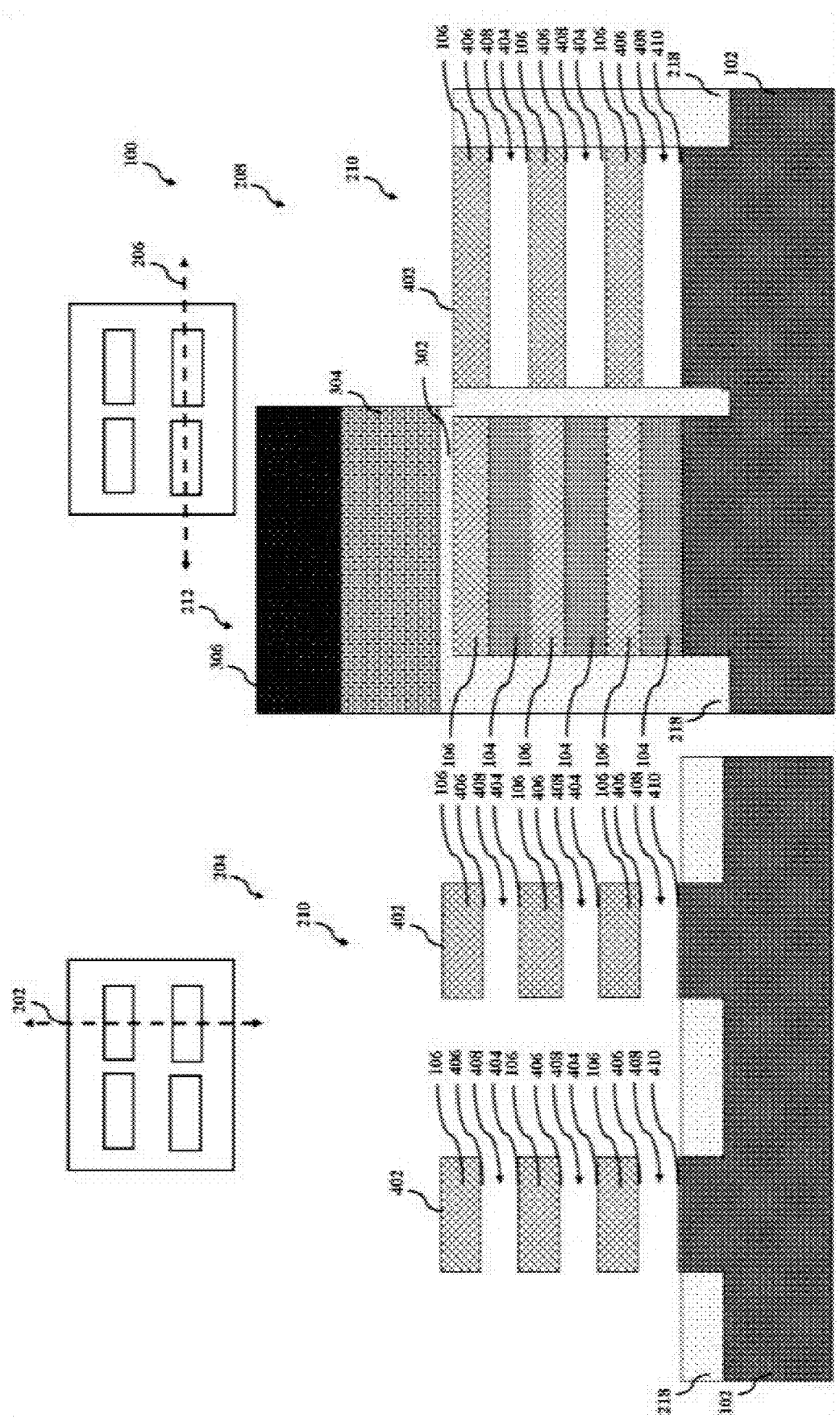
FIG. 4 illustrates a semiconductor device of FIG. 3 facilitating producing strained nanosheet FETs using alternating layers of a phase change material including removal of a portion of the sacrificial gate and the sacrificial channel material layer in accordance with one or more embodiments described herein.

FIG. 4 illustrates a semiconductor device 100 of FIG. 3 facilitating producing strained nanosheet FETs using alternating layers of a phase change material including removal of a portion of the sacrificial gate material layer 304 and the sacrificial channel material layer 104 in accordance with one or more embodiments described herein. The block 306 can remain over and protect the nFET region 212 during removal of a portion of the sacrificial gate material layer 304 and the sacrificial channel material layer 104 in the pFET region 210. A portion of the sacrificial gate material layer 304 and the dielectric layer 302 on the fins 216 in the pFET region can be removed using, for example, by any suitable plasma etch, wet etch, or a combination of both plasma etch and wet etch processes. Removal of a portion of the sacrificial gate material layer 304 and the dielectric layer 302 on the fins 216 in the pFET region can expose a top surface 402 of the top channel material layer 106. The sacrificial channel material layer 104 in the pFET region can be removed to expose top surfaces 404 and bottom surfaces 406 of the channel material layer 106. The sacrificial channel material layer 104 can be removed using a wet etching solution such as, for example, a mix of ammonium hydroxide, hydrogen peroxide, and water solution (SC1). Removal of the sacrificial channel material layer 104 can form openings 408. Additionally, a top surface 410 of the substrate 102 can be exposed. Furthermore, cross-section 204 illustrates removal of the dielectric layer 302 and the sacrificial gate material layer 304

Figure 5:
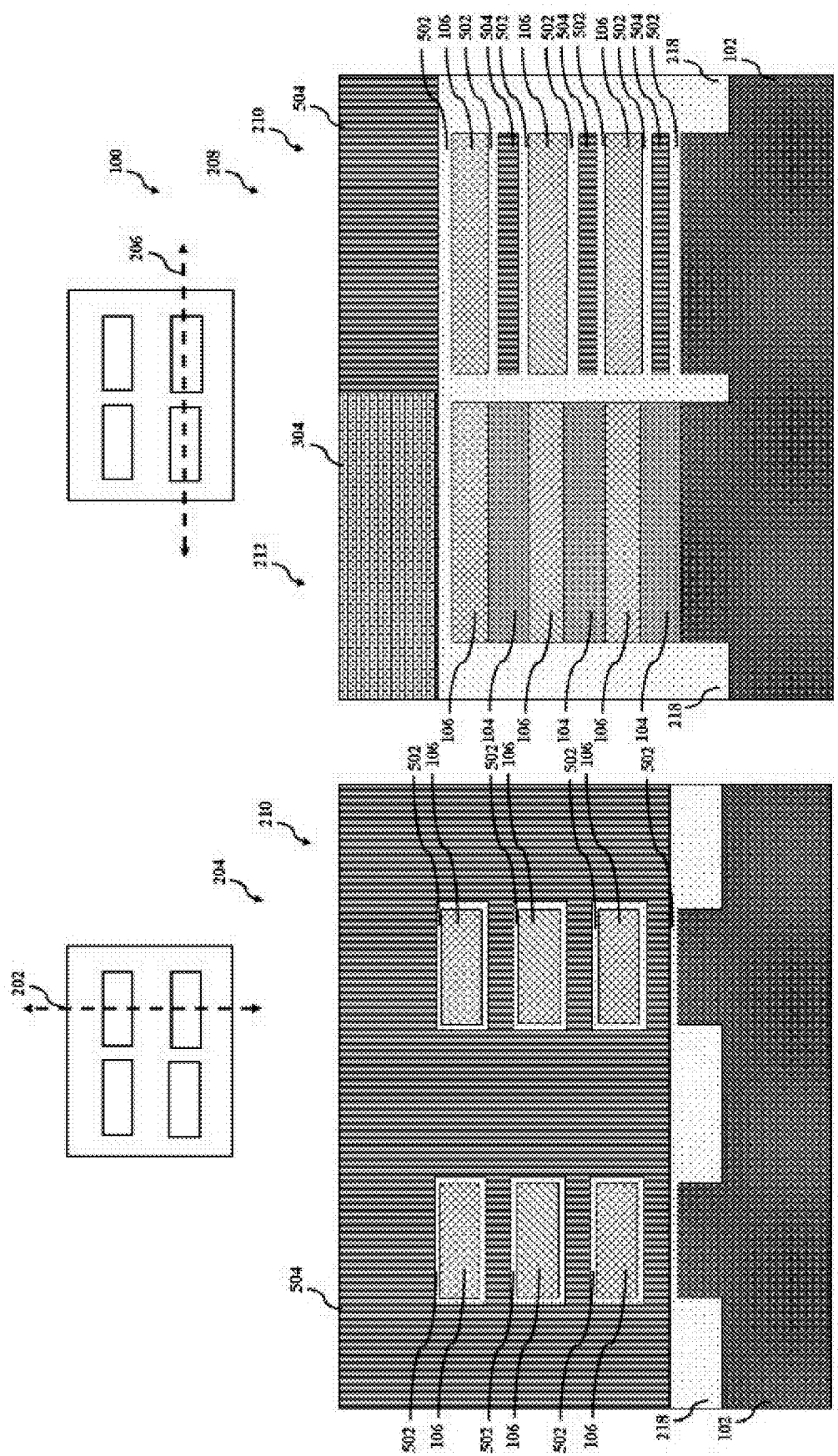
FIG. 5 illustrates a semiconductor device of FIG. 4 facilitating producing strained nanosheet FETs using alternating layers of a phase change material including a dielectric layer and a phase change material layer in accordance with one or more embodiments described herein.

FIG. 5 illustrates a semiconductor device 100 of FIG. 4 facilitating producing strained nanosheet FETs using alternating layers of a phase change material including a dielectric layer 502 and a phase change material layer 504 in accordance with one or more embodiments described herein. The dielectric layer 502 can be formed using conformal oxide deposition to coat a layer on the sacrificial channel material layer 104. The conformal oxide deposition can be, but is not limited to, ALD to deposit a thin film on the sacrificial channel material layer 104 until a determined thickness is reached. The dielectric layer 502 can be formed from any appropriate dielectric material. In preferred embodiments, the dielectric layer 502 can be an oxide such as silicon dioxide. The dielectric layer 502 can be used to protect the channel material layer 106 from downstream processing. Non-limiting thickness of the dielectric layer 502 can range from 1 nm to 3 nm.

The phase change material layer 504 can be deposited to fill the openings 406 and form a layer on the fins 216 in the pFET region 210. The phase change material layer 504 can also be deposited around the fins 216 as illustrated in cross-section 204. In some embodiments, the phase change material can be deposited by ALD or CVD. The deposition temperature can be below 200° C. so that after deposition the phase change material has an amorphous phase. CMP can be used to polish the phase change material 504 to about the height of the sacrificial gate material layer 304. The block 306 used as a patterning mask can be removed.

The phase change material layer 504 can be formed from a-GST. As illustrated further below, annealing at >300° C. can cause the a-GST to become crystallized and transform into c-GST, which can result in a volume reduction of ~6%. The reduction in volume can introduce a compressive strain into the channel material layer 106 (e.g., a nanosheet stacked silicon channels). Further patterning of a source and drain recess and forming source and drain epitaxial growths on the sides of the fins 216 (e.g., ends of the channel material layer 106) can lock the compressive strain in the channel material layer 106.

Figure 6:
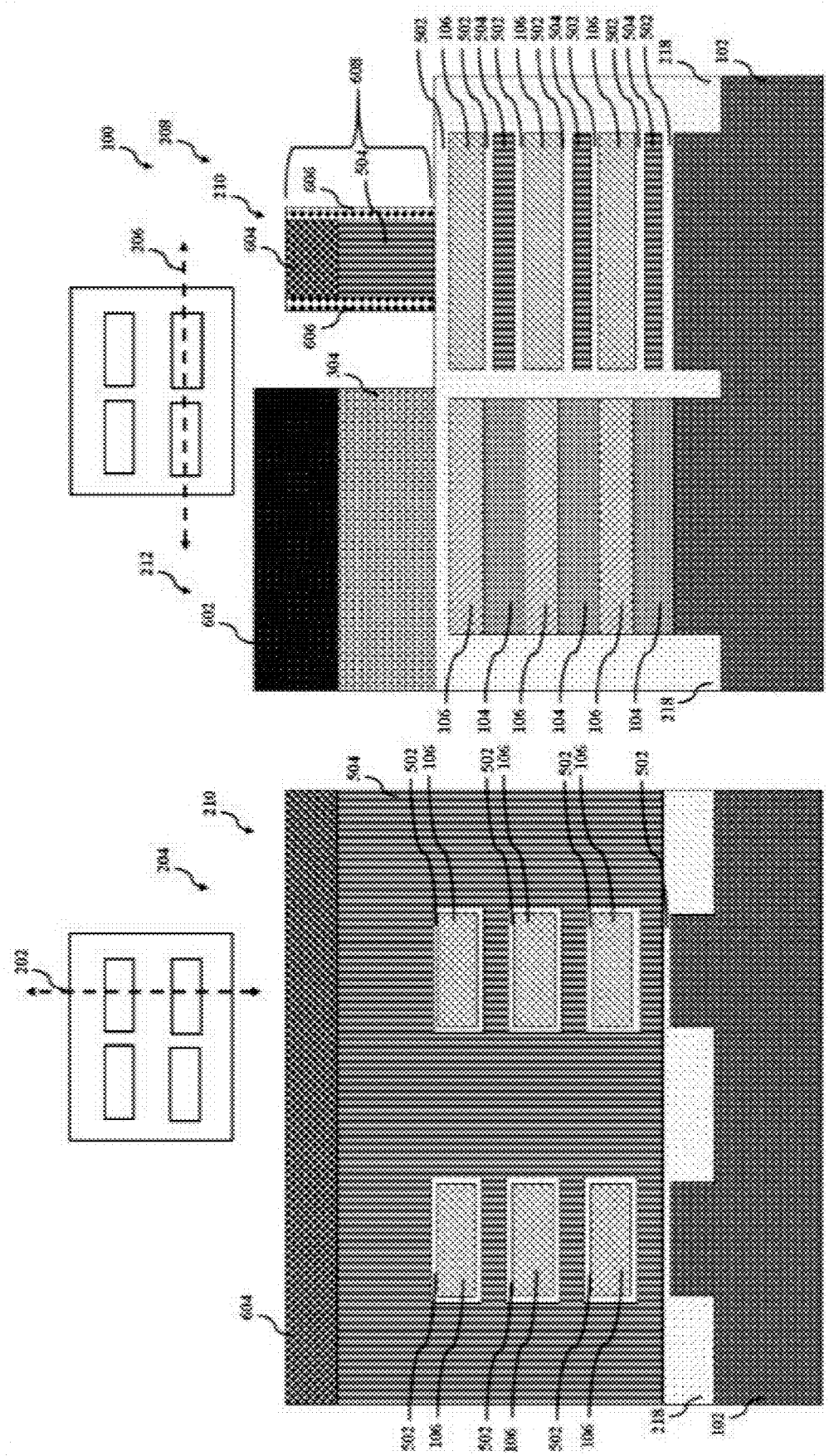
FIG. 6 illustrates a semiconductor device of FIG. 5 facilitating producing strained nanosheet FETs using alternating layers of a phase change material including a sacrificial gate in accordance with one or more embodiments described herein.

FIG. 6 illustrates a semiconductor device 100 of FIG. 5 facilitating producing strained nanosheet FETs using alternating layers of a phase change material including a sacrificial gate 608 in accordance with one or more embodiments described herein. A block 602 can be formed over the nFET region 212 to protect the nFET region 212. The block 602 can be a photolithography mask such as, for example, an OPL used to block some regions from processes. The PC gate 608 can be formed on the fins 216 in the pFET region 210. To form the sacrificial gate 608, a hardmask 604 can be deposited over a portion of the phase change material 504 formed over the fins 216 in the pFET region 210. The width of the hardmask 604 can determine the width of the sacrificial gate 608. An etching process such as RIE can be used to pattern the sacrificial gate 608 by etching the phase change material 504 down to the width of the hardmask 604. Spacers 606 can be formed on the sides of the sacrificial gate 608. The spacers 606 can be formed from any suitable material. Exemplary suitable materials for forming the spacers 606 can include silicon nitride or siliconborocarbonitride.

Figure 7:
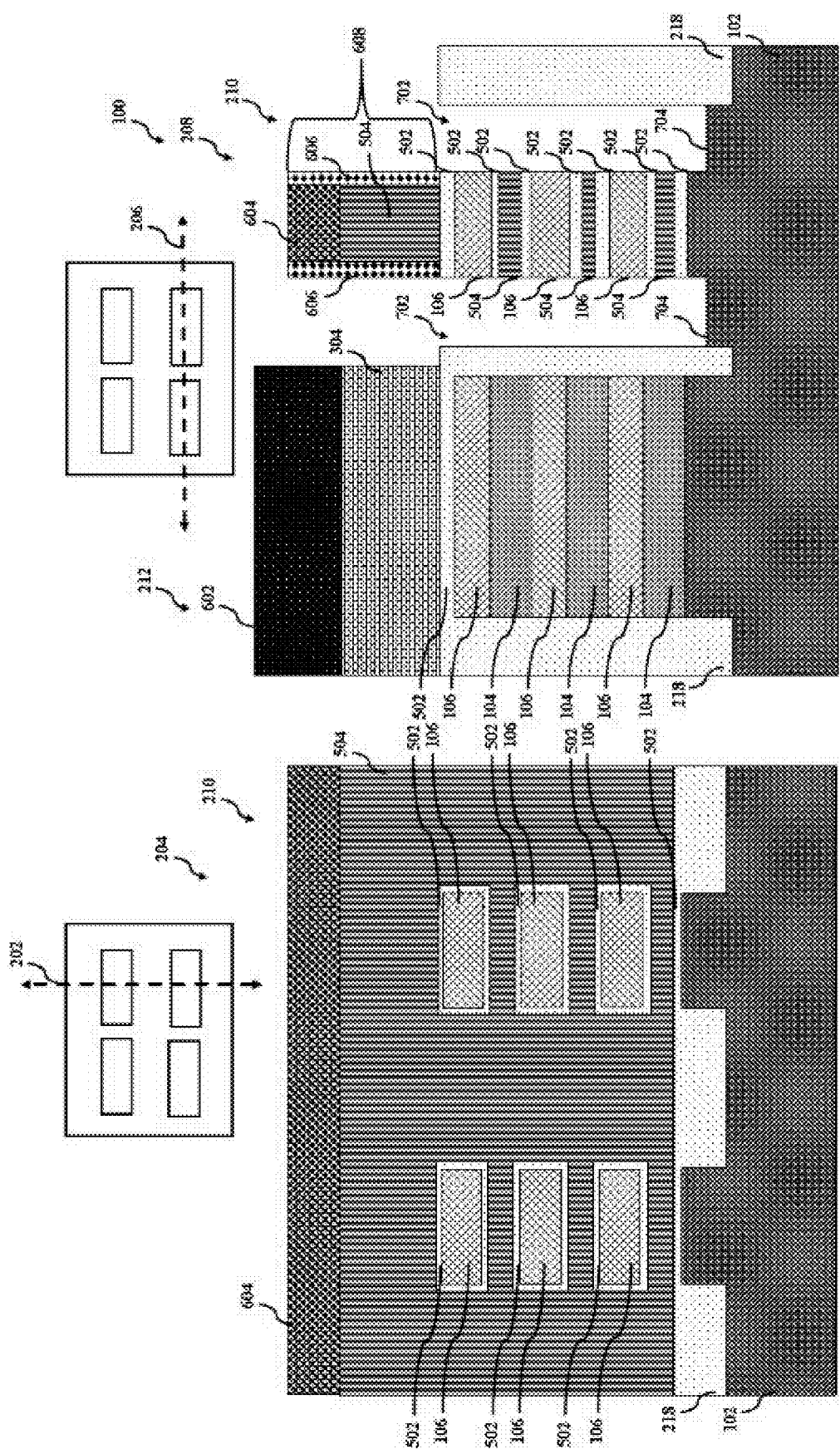
FIG. 7 illustrates a semiconductor device of FIG. 6 facilitating producing strained nanosheet FETs using alternating layers of a phase change material including a source and drain recess in accordance with one or more embodiments described herein.

FIG. 7 illustrates a semiconductor device 100 of FIG. 6 facilitating producing strained nanosheet FETs using alternating layers of a phase change material including a source and drain recess 702 in accordance with one or more embodiments described herein. The block 602 can remain over and protect the nFET region 212 during formation of the source and drain recess 702. The nanosheets or fins 216 in the pFET region 210 can be recessed for source and drain epitaxial growths as described below. The source and drain recess 702 can be formed by an etching process such as, for example, directional RIE. The source and drain recess 702 can be formed in the pFET region 210. The nanosheets or fins 216 in the pFET region 210 can be recessed down to about the width of the sacrificial gate 608 including the spacers 606. Additionally, a portion of the substrate 102 can be etched back exposing top surfaces 704.

Figure 8:
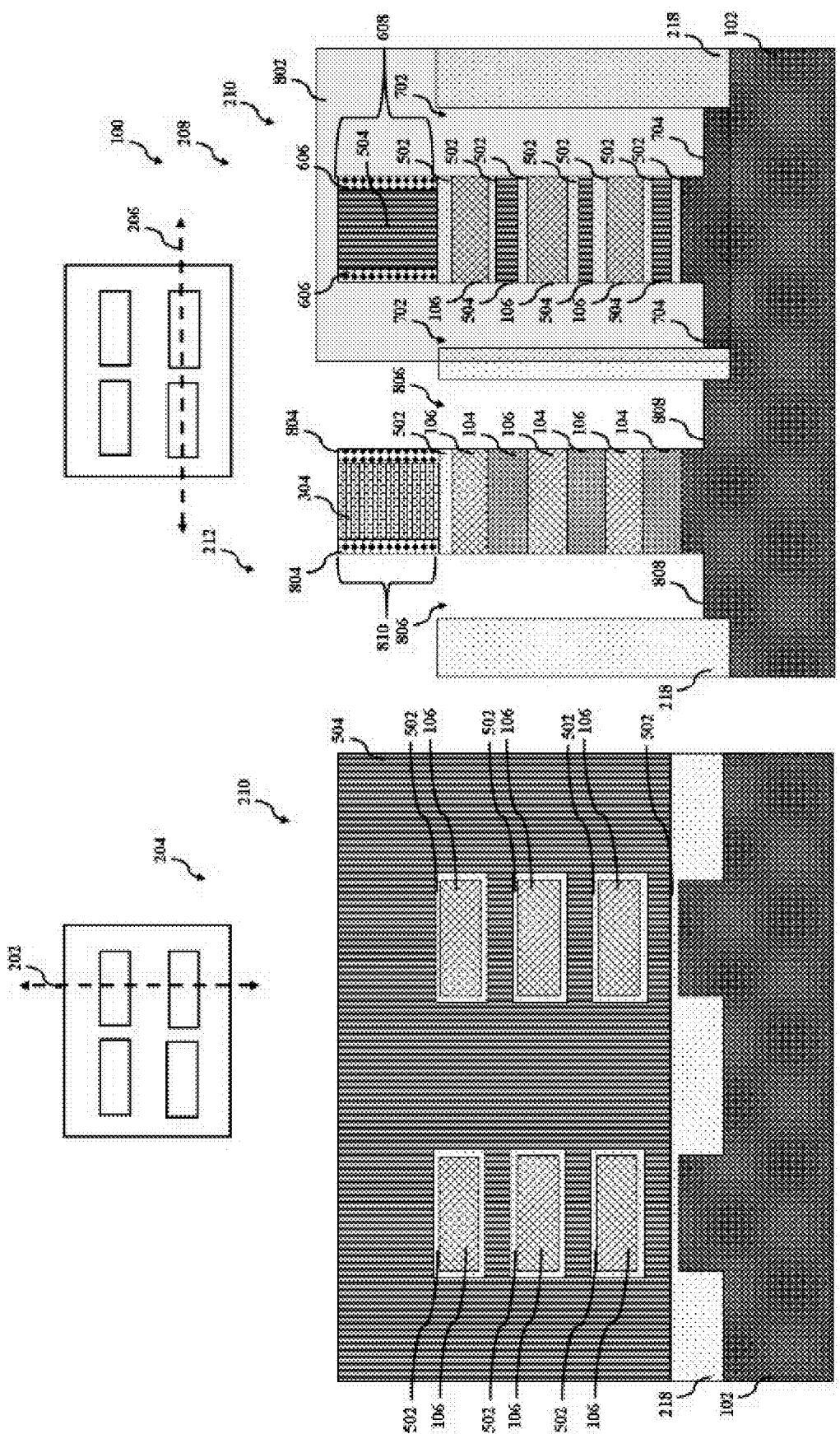
FIG. 8 illustrates a semiconductor device of FIG. 7 facilitating producing strained nanosheet FETs using alternating layers of a phase change material including a sacrificial gate and a source and drain recess in the n-type FET (nFET) region in accordance with one or more embodiments described herein.

FIG. 8 illustrates a semiconductor device 100 of FIG. 7 facilitating producing strained nanosheet FETs using alternating layers of a phase change material including a sacrificial gate 810 and a source and drain recess 806 in the nFET region 212 in accordance with one or more embodiments described herein. The hardmask 604 and portions of the spacers 606 adjacent to the hardmask 604 in the sacrificial gate 608 can be removed.

A block 802 can be used to protect the pFET region 210 during patterning of the nFET region 212. The block 802 can be a photolithography mask such as, for example, an OPL used to block some regions from processes. The block 602 over the nFET region 212 can be removed. The block 602 can be removed by any suitable methods. For example, the block 602 can be removed using sulfuric acid and hydrogen peroxide. The sacrificial gate material layer 304 can be patterned by placing a hardmask (not shown) over the sacrificial gate material layer 304, and the sacrificial gate material layer 304 can be etched down to about the width of the hardmask. The width of the hardmask can determine the width of the sacrificial gate 810. An etching process such as RIE can be used to pattern the sacrificial gate 810 by etching the sacrificial gate material layer 304 down to the width of the hardmask. Spacers 804 can be formed on the sides of the sacrificial gate 810. The spacers 804 can be formed from any suitable material. Exemplary suitable materials for forming the spacers 606 can include silicon nitride or siliconborocarbonitride.

The nanosheets or fins 216 in the nFET region 212 can be recessed for source and drain epitaxial growths as described below. The source and drain recess 806 can be formed by an etching process such as, for example, directional RIE. The source and drain recess 806 can be formed in the nFET region 210. The nanosheets or fins 216 in the nFET region 212 can be recessed down to about the width of the sacrificial gate 810 including the spacers 804. Additionally, a portion of the substrate 102 can be etched back exposing top surfaces 808. The hardmask used to pattern the sacrificial gate 810 and portions of the spacers 804 adjacent to the hardmask can be removed.

Figure 9:
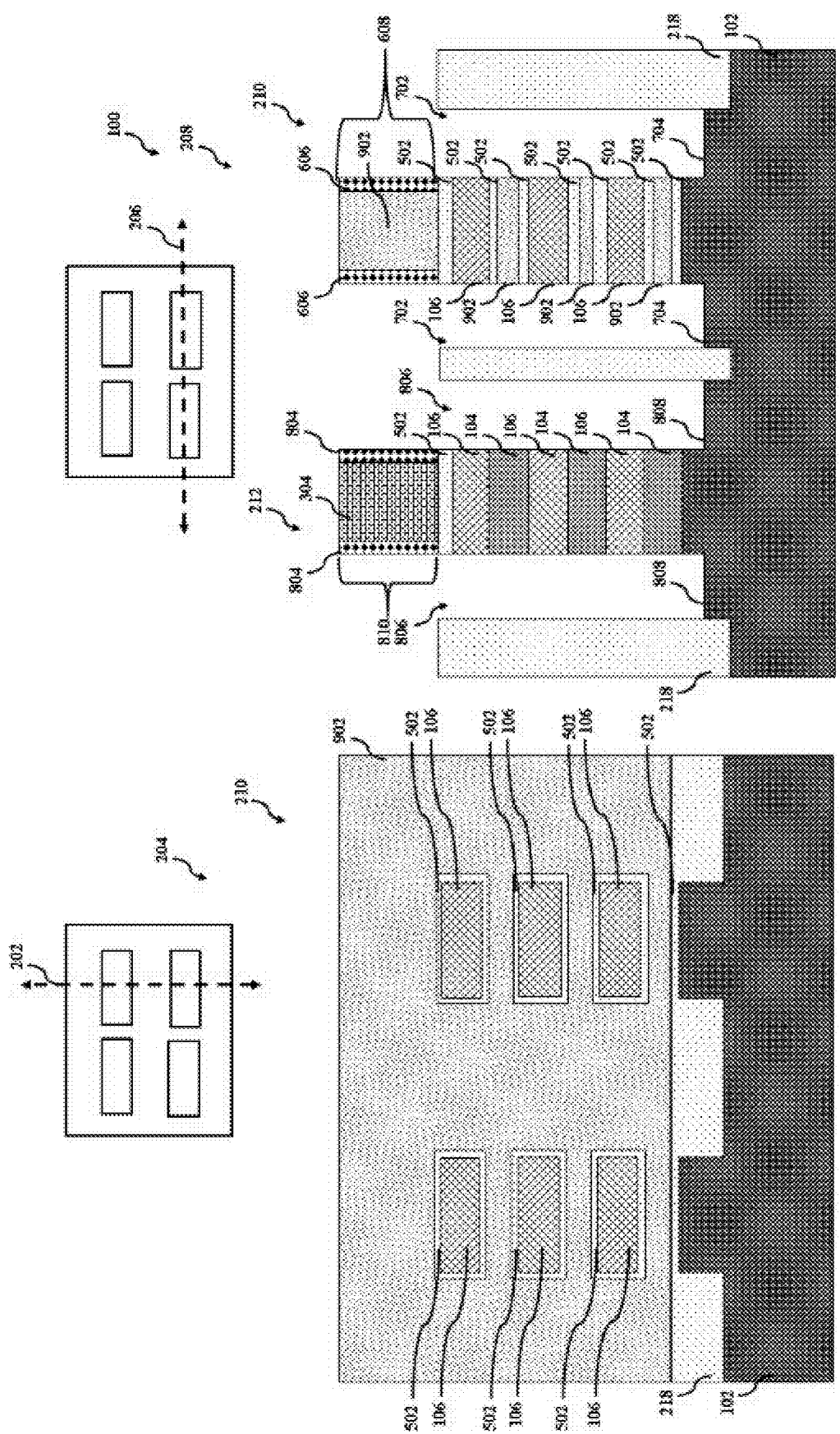
FIG. 9 illustrates a semiconductor device of FIG. 8 facilitating producing strained nanosheet FETs using alternating layers of a phase change material including transforming the phase change material layer to crystalline germanium antimony telluride (c-GST) in accordance with one or more embodiments described herein.

FIG. 9 illustrates a semiconductor device 100 of FIG. 8 facilitating producing strained nanosheet FETs using alternating layers of a phase change material including transforming the phase change material layer 504 to c-GST 902 in accordance with one or more embodiments described herein. The block 802 can be removed and the phase change material 504 can be transformed into c-GST 902. The block 802 can be removed by any suitable methods. For example, the block 802 can be removed using sulfuric acid and hydrogen peroxide. The phase change material 504 can be crystallized by annealing >300° C.

The transformation into the c-GST 902 can result in a volume reduction of ~6%. The volume reduction can cause a compressive strain in the channel material layer 106 (e.g., a nanosheet stacked silicon channels). As illustrated further below, source and drain epitaxial growths in the source and drain recess 702 at the ends of the channel material layer 106 can lock the compressive strain in the channel material layer 106.

Figure 10:
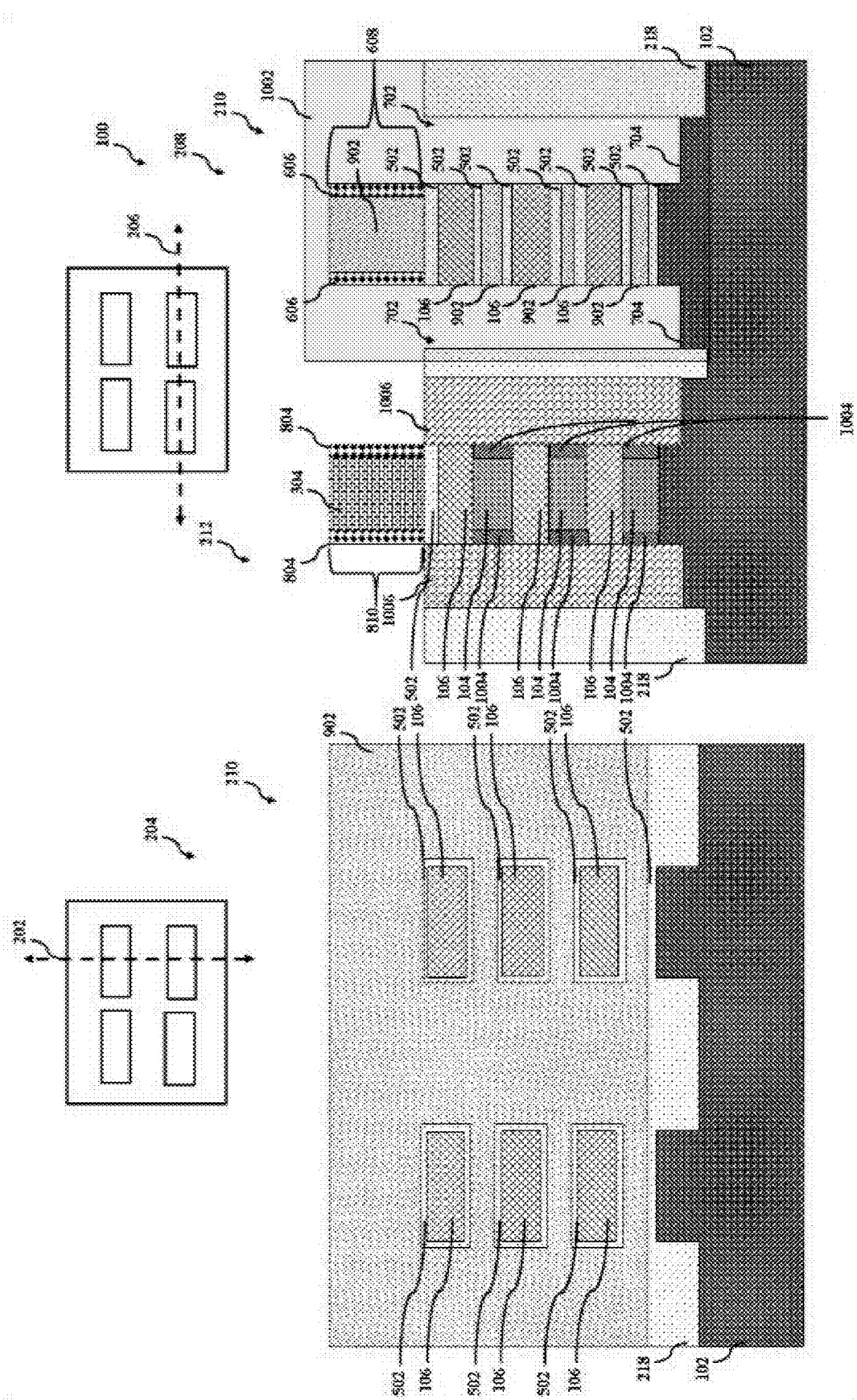
FIG. 10 illustrates a semiconductor device of FIG. 9 facilitating producing strained nanosheet FETs using alternating layers of a phase change material including inner spacers and source and drain epitaxial growths in the nFET region in accordance with one or more embodiments described herein.

FIG. 10 illustrates a semiconductor device 100 of FIG. 9 facilitating producing strained nanosheet FETs using alternating layers of a phase change material including inner spacers 1004 and source and drain 1006 epitaxial growths in the nFET region 212 in accordance with one or more embodiments described herein. A block 1002 can be used to protect the pFET region 210 during formation of the inner spacers 1004 and the source and drain 1006 epitaxial growths. The block 1002 can be a photolithography mask such as, for example, an OPL used to block some regions from processes. The inner spacers 1004 can be formed by recessing the ends of the channel material layer 106 and depositing inner spacer material. The channel material layer 106 can be recessed using various methods such as, for example, wet etching using an SC1 solution or dry isotropic etching. The inner spacers can be silicon nitride or silicon-borocarbonitride. The source and drain 1006 epitaxial growths can be formed in the source and drain recess 806.

To form the source and drain 1006, a doped layer (not shown) can be deposited alongside the fins 216. The doped layer can serve as a dopant source for forming the source and drain 1006. The particular dopant employed can depend on whether the source and drain 1006 is an nFET or a pFET. In the case of an nFET, the dopant can include an n-type dopant such as, for example, phosphorus, arsenic, antimony for silicon. In the case of a pFET, the dopant can include a p-type dopant such as, for example, boron, gallium, or indium, for silicon or silicon germanium. Dopants can be incorporated into the source and drain by any suitable doping techniques including, but not limited to, ion implantation, gas phase doping, plasma doping, plasma immersion ion implantation, cluster doping, infusion doping, liquid phase doping, solid phase doping, and/or any suitable combination of those techniques. In some embodiments, dopants can be activated by thermal annealing such as, but not limited to, laser annealing, flash annealing, rapid thermal annealing (RTA) or any suitable combination of those techniques. In one embodiment, the source and drain can be formed by epitaxial growths with in-situ doping, e.g., dopants can be incorporated into epitaxial source and drain during the epitaxy process.

Figure 11:
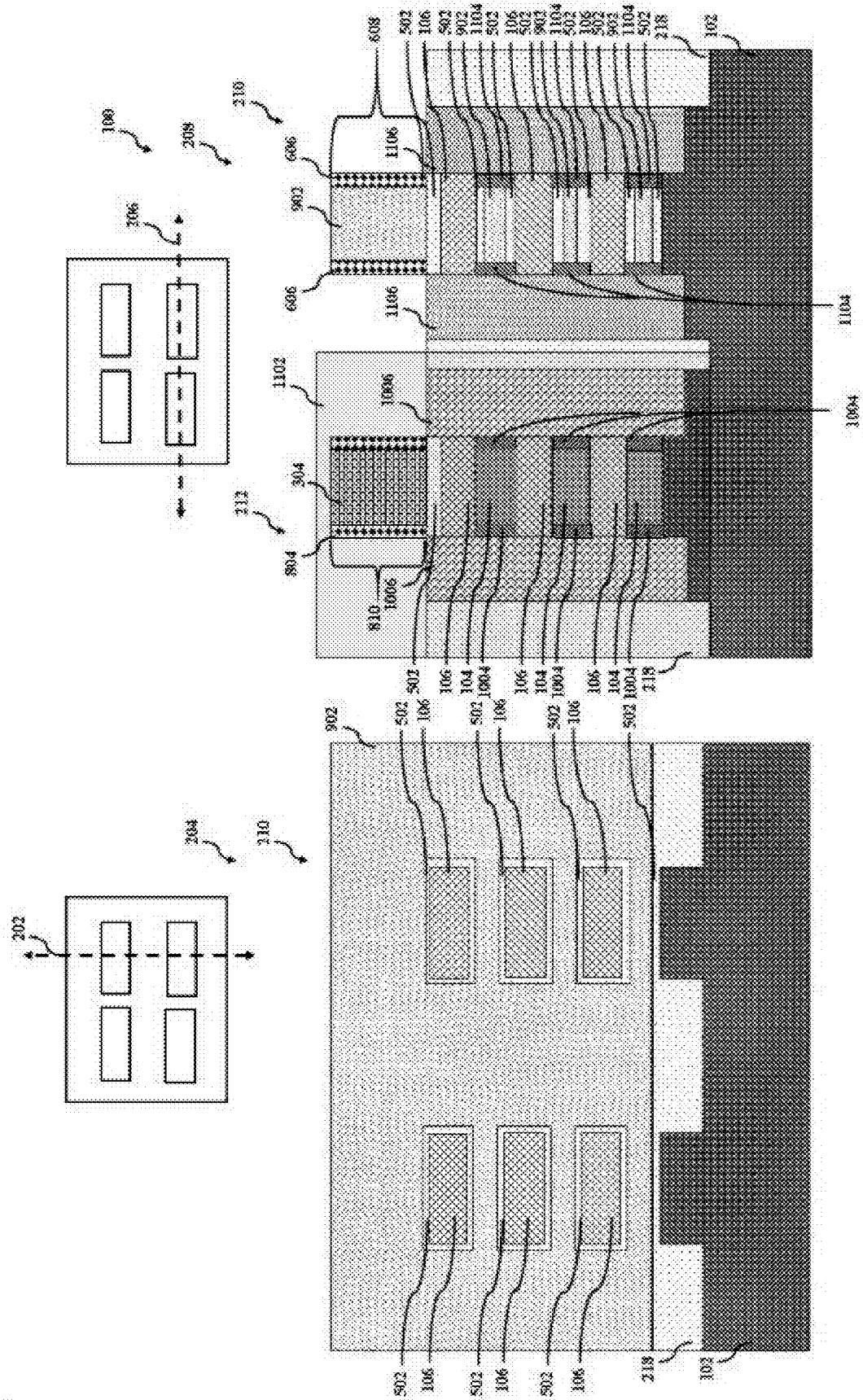
FIG. 11 illustrates a semiconductor device of FIG. 10 facilitating producing strained nanosheet FETs using alternating layers of a phase change material including inner spacers and source and drain epitaxial growths in the pFET region in accordance with one or more embodiments described herein.

FIG. 11 illustrates a semiconductor device 100 of FIG. 10 facilitating producing strained nanosheet FETs using alternating layers of a phase change material including inner spacers 1104 and source and drain 1106 epitaxial growths in the pFET region 210 in accordance with one or more embodiments described herein. The block 1002 can be removed to pattern the inner spacers 1104 and the source and drain 1106 in the pFET region. The block 1002 can be removed using any suitable methods. For example, the block 1002 can be removed using sulfuric acid and hydrogen peroxide. A block 1102 can be used to protect the nFET region 212 during formation of the inner spacers 1104 and the source and drain 1106 epitaxial growths. The block 1102 can be a hardmask material such as, for example, silicon nitride used to block some regions from processes. The inner spacers 1104 can be formed by recessing the ends of the c-GST 902 that form the fins 216 and depositing inner spacer material. The c-GST 902 can be recessed by various methods such as, for example, wet etching or dry isotropic etching. The inners spacers 1104 can be formed from, for example, silicon nitride or siliconborocarbonitride. Additionally, a portion of the dielectric layer 502 along the c-GST 902 that form the fins 216 can be recessed and inner spacer material deposited. The source and drain 1106 epitaxial growths can be formed in the source and drain recess 702.

To form the source and drain 1106, a doped layer (not shown) can be deposited alongside the fins 216. The doped layer can serve as a dopant source for forming the source and drain 1106. As mentioned above, the particular dopant employed can depend on whether the source and drain 1106 is an nFET or a pFET. In the case of an nFET, the dopant can include an n-type dopant. In the case of a pFET, the dopant can include a p-type dopant. According to exemplary embodiments, an nFET source and drain can comprise in-situ phosphorus doped silicon and a pFET source and drain can comprise in-situ boron doped silicon germanium.

Figure 12:
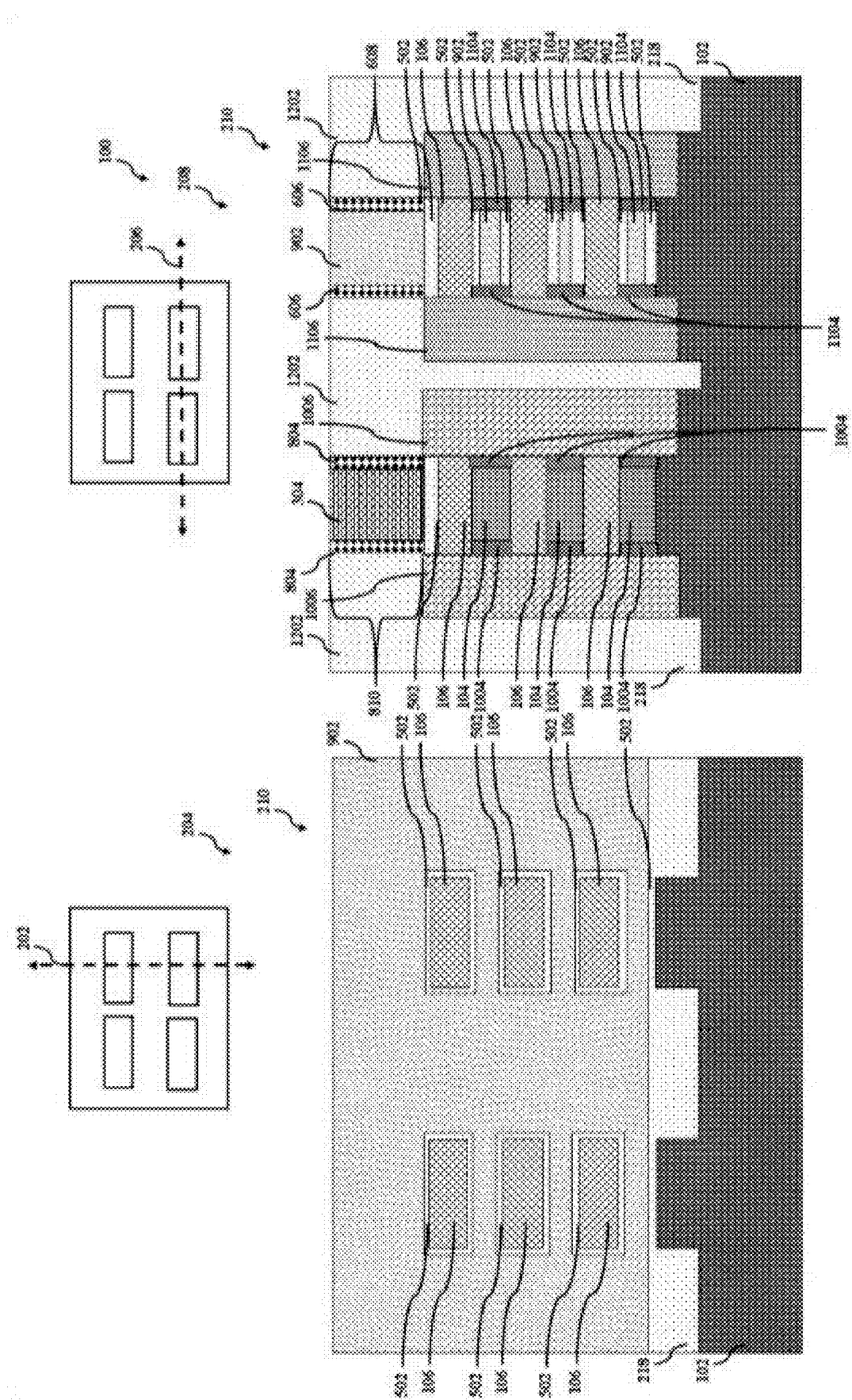
FIG. 12 illustrates a semiconductor device of FIG. 11 facilitating producing strained nanosheet FETs using alternating layers of a phase change material including a dielectric fill extending a height of the sacrificial gates in accordance with one or more embodiments described herein.

FIG. 12 illustrates a semiconductor device 100 of FIG. 11 facilitating producing strained nanosheet FETs using alternating layers of a phase change material including a dielectric fill 1202 extending a height of the sacrificial gates 608 and 810 in accordance with one or more embodiments described herein. The dielectric fill 1202 can be formed over the nFET region 212 and the pFET region 210 using a dielectric material such as an oxide, but not limited to, silicon dioxide. The dielectric fill 1202 can be formed using a FCVD. Excess dielectric material can be removed using CMP. The dielectric fill 1202 can be polished down to the height of the sacrificial gates 608 and 810.

Figure 13:
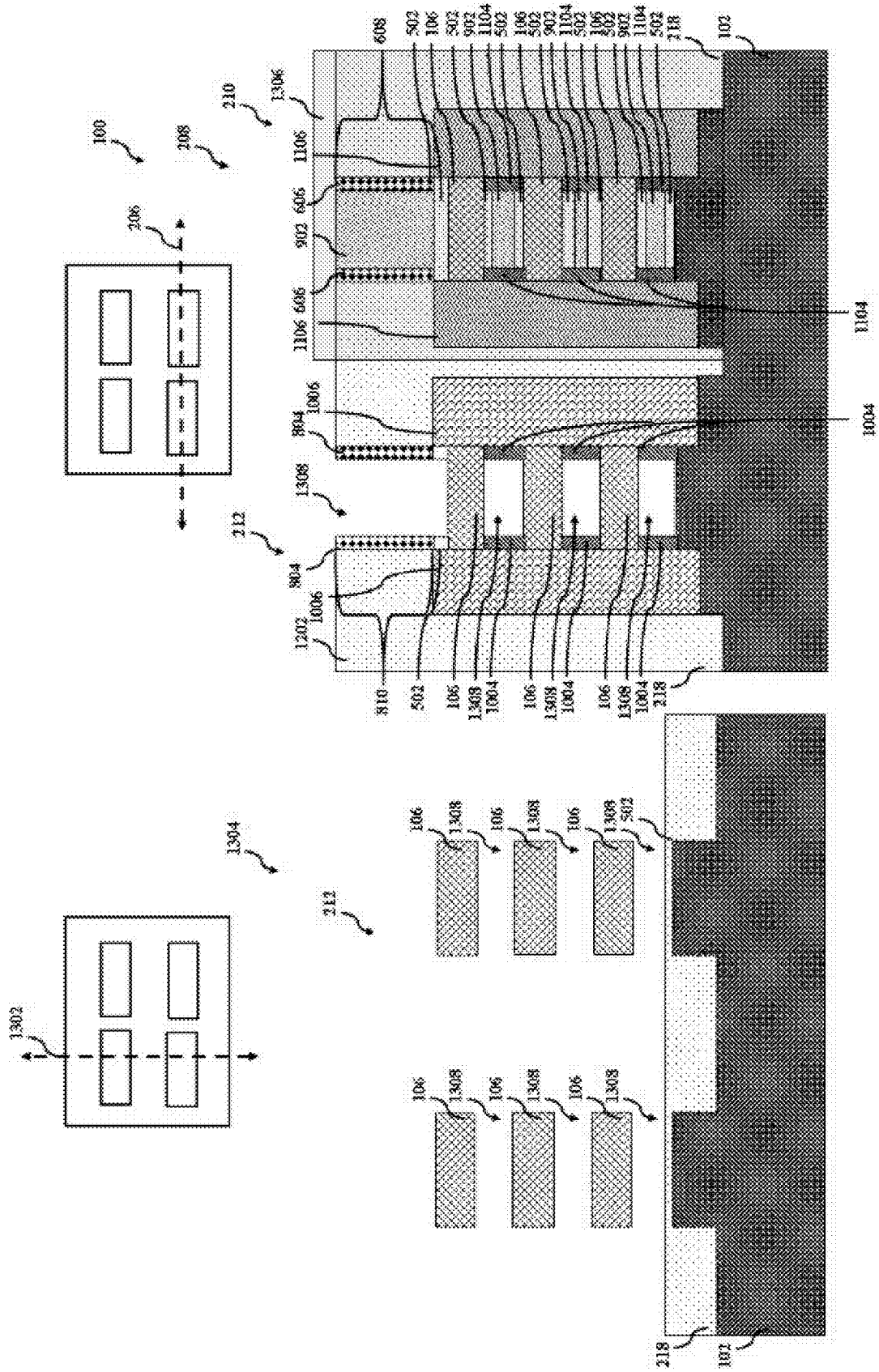
FIG. 13 illustrates a semiconductor device of FIG. 12 facilitating producing strained nanosheet FETs using alternating layers of a phase change material including removal of the sacrificial gate material layer and the channel material layer in the nFET region for a replacement metal gate (RMG) in accordance with one or more embodiments described herein.

FIG. 13 illustrates a semiconductor device 100 of FIG. 12 facilitating producing strained nanosheet FETs using alternating layers of a phase change material including removal of the sacrificial gate material layer 304 and the channel material layer 106 in the nFET region 212 for an RMG in accordance with one or more embodiments described herein. A cross-sectional line 1302 can depict the location of a cross-sectional view corresponding to the cross-section 1304. The cross-sectional line 1302 can cross through the nFET region 212. The cross-section 1304 can be an illustration of the nFET region 212.

A block 1306 can be used to protect the pFET region 210 during the removal of the sacrificial gate material layer 304. The sacrificial gate material layer 304 can be removed using, for example, wet etching with ammonium hydroxide. The sacrificial channel material layer 104 can be removed using, for example, wet etching with an SC1 solution. The removal of the sacrificial gate material layer 304 can form openings 1308 in the nFET region 212. The openings 1308 can be used for an RMG as described below.

Figure 14:
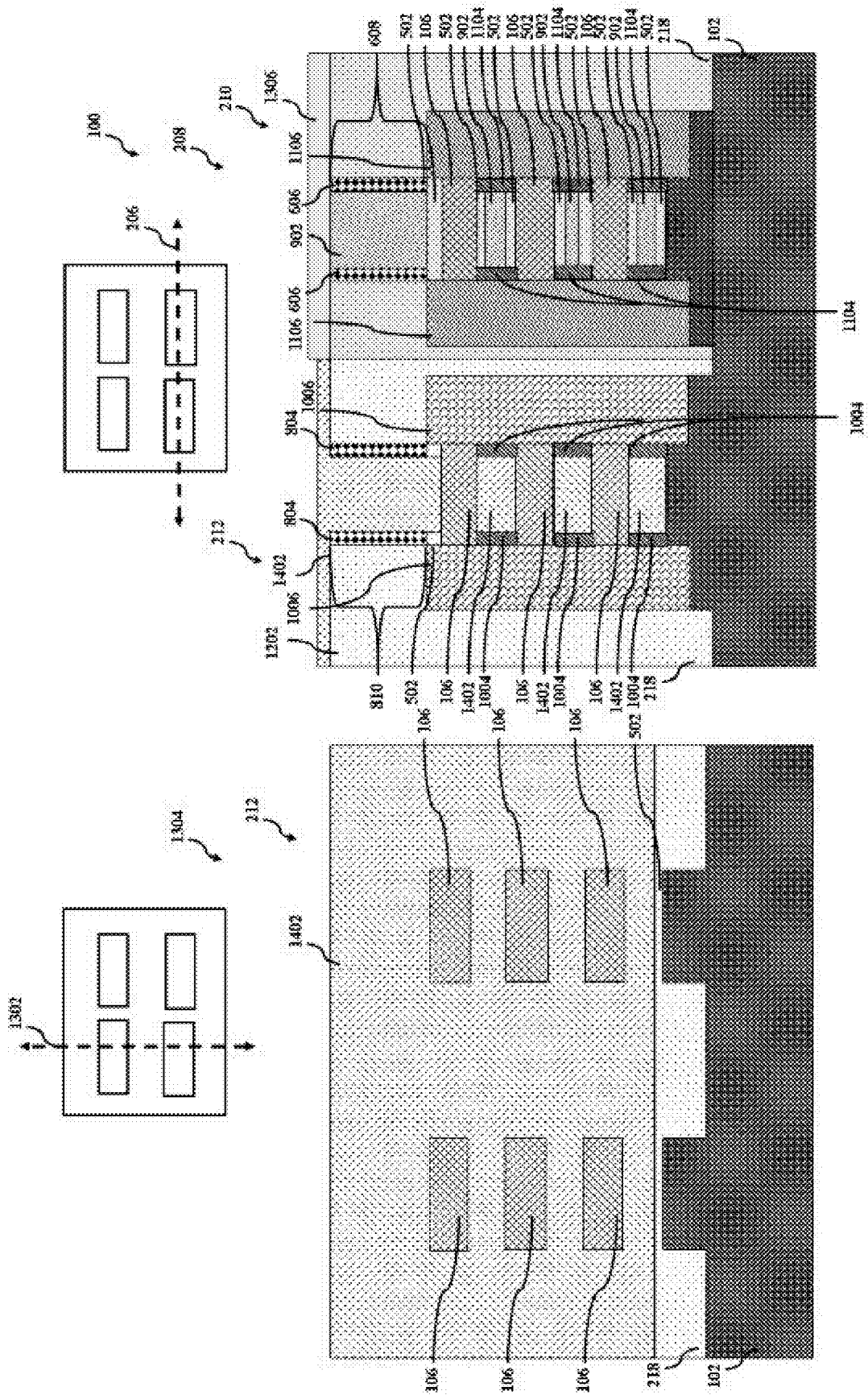
FIG. 14 illustrates a semiconductor device of FIG. 13 facilitating producing strained nanosheet FETs using alternating layers of a phase change material including an RMG in the nFET region in accordance with one or more embodiments described herein.

FIG. 14 illustrates a semiconductor device 100 of FIG. 13 facilitating producing strained nanosheet FETs using alternating layers of a phase change material including an RMG 1402 in the nFET region 212 in accordance with one or more embodiments described herein. The block 1306 can remain over and protect the pFET region 210 during the formation of the RMG 1402. The RMG 1402 can comprise a high-k dielectric and a work function metal (WFM) formed by using, for example, CVD. To pattern the RMG 1402, a gate dielectric layer can be deposited on the surfaces of the openings 1308 and a gate conductor metal can be deposited onto the gate dielectric layer.

According to exemplary embodiments, the RMG 1402 can be formed wherein the gate dielectric layer can be a high-k dielectric and the gate conductor metal can be a metal or combination of metals. The gate dielectric layer can be any appropriate insulating material. A high-k dielectric material can be a material having a dielectric constant k that can be higher than that of silicon dioxide. Examples of high-k materials can include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum and aluminum.

The gate conductor metal can be a WFM. The gate conductor metal can be any appropriate conductive material including, but is not limited to, metals such as tungsten, nickel, titanium, molybdenum, tantalum, copper, platinum, silver, gold, ruthenium, iridium, rhenium, rhodium, and alloys thereof, polysilicon, or a conducting metallic compound material such as tantalum nitride, titanium nitride, tungsten silicide, tungsten nitride, ruthenium oxide, cobalt silicide, or nickel silicide. The gate conductor metal can further include dopants that can be incorporated during or after deposition.

Figure 15:
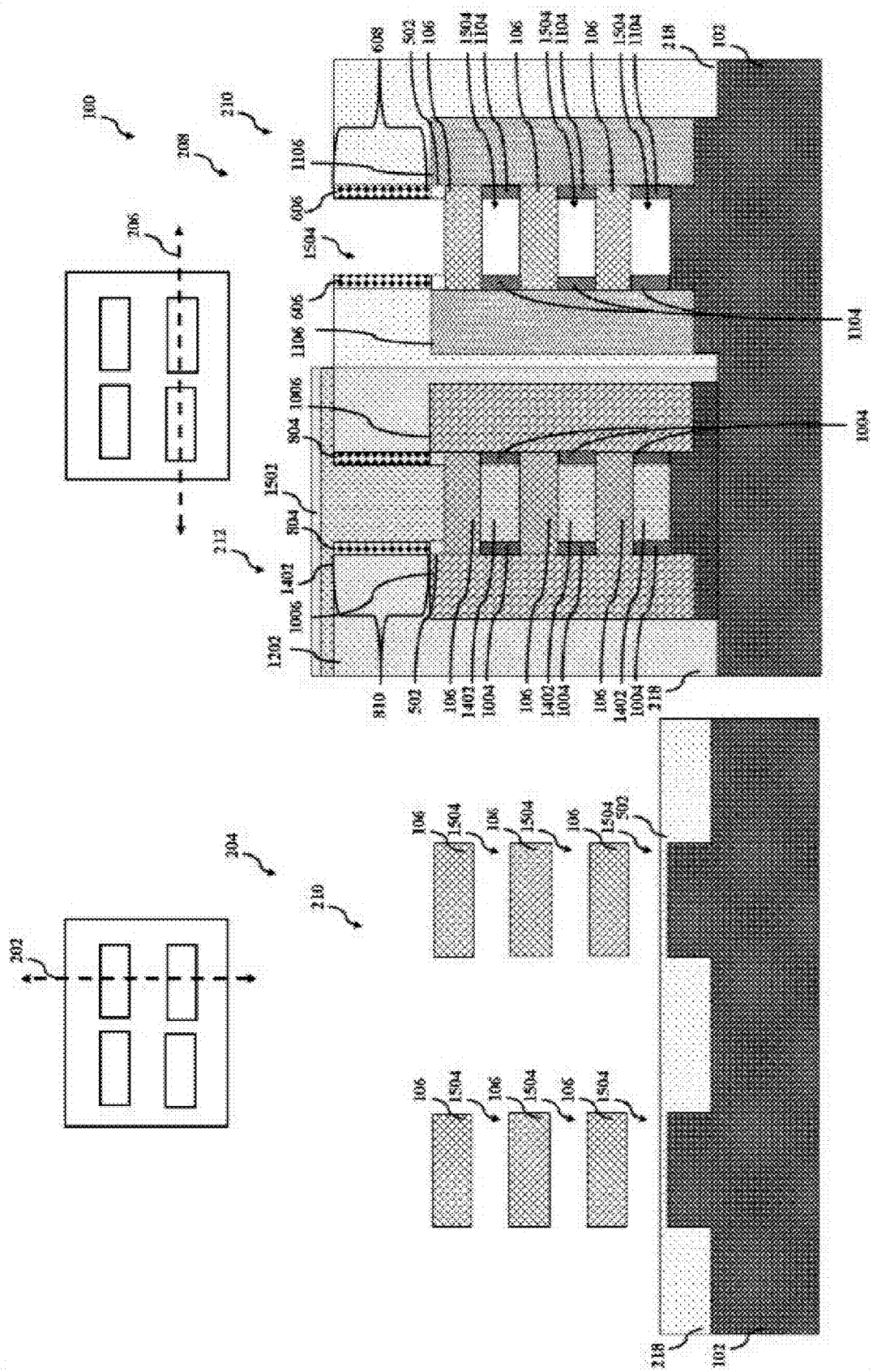
FIG. 15 illustrates a semiconductor device of FIG. 14 facilitating producing strained nanosheet FETs using alternating layers of a phase change material including removal of the c-GST in the p-type FET (pFET) region for an RMG in accordance with one or more embodiments described herein.

FIG. 15 illustrates a semiconductor device 100 of FIG. 14 facilitating producing strained nanosheet FETs using alternating layers of a phase change material including removal of the c-GST 902 in the pFET region 210 for an RMG in accordance with one or more embodiments described herein. A block 1502 can be used to protect the nFET region 212 during removal of the c-GST 902 in the pFET region 210. The block 1502 can be a mask such as, for example, a hardmask such as silicon nitride used to block some regions from processes. The block 1306 can be removed for the removal of the c-GST 902 in the pFET region 210. The c-GST can be removed using various etching techniques such as, for example, wet etching or dry isotropic etching. Additionally, a portion of the dielectric layer 502 along the c-GST 902 that form the fins 216 can also be removed. A portion of the dielectric layer 502 along the c-GST 902 can be removed with techniques such as, for example, a wet etching using diluted hydrofluoric acid (DHF). The removal of the c-GST 902 and a portion of the dielectric layer 502 along the c-GST 902 that form the fins 216 can form openings 1504 in the pFET region 210. The openings 1504 can be used for an RMG as described below.

Figure 16:
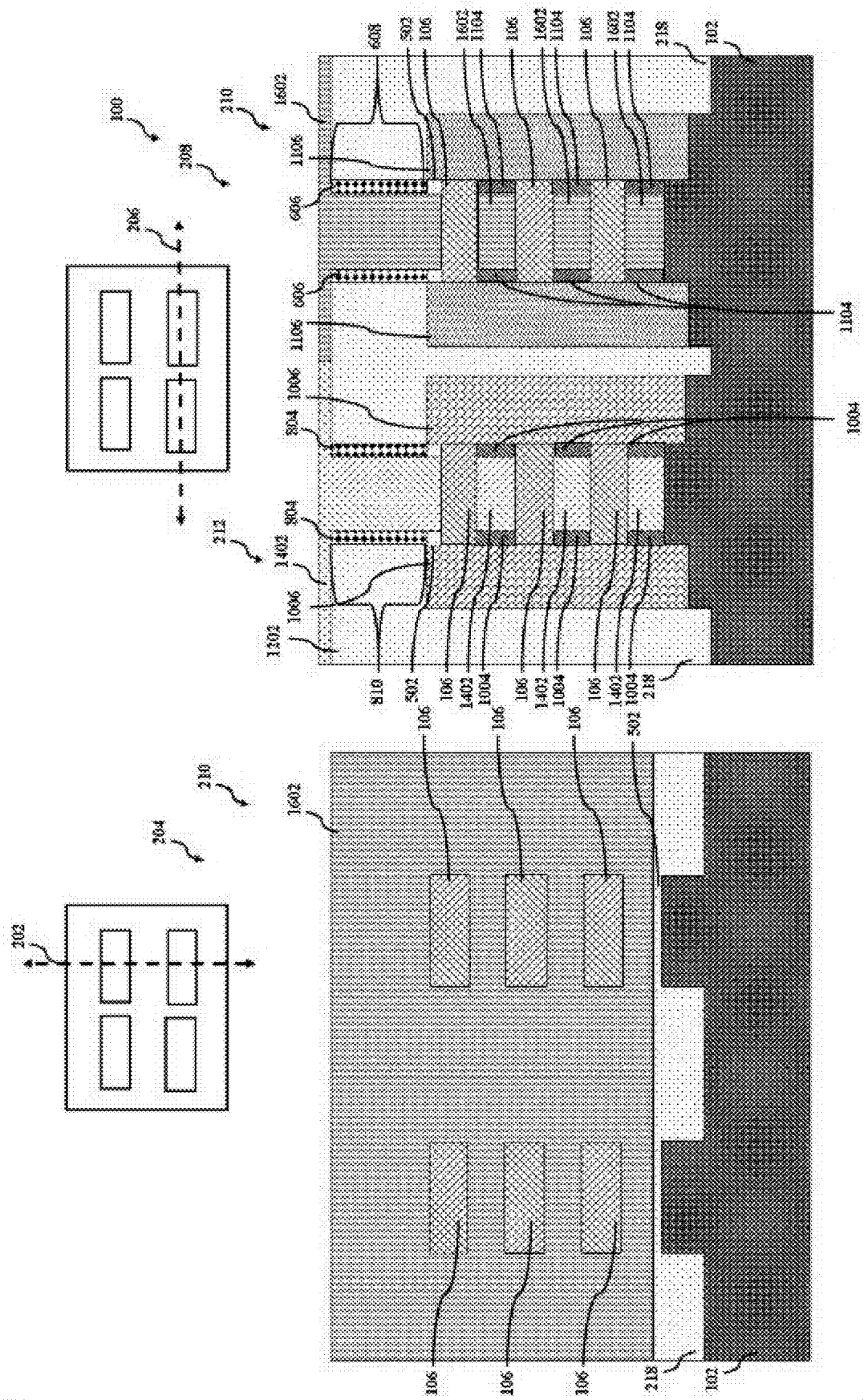
FIG. 16 illustrates a semiconductor device of FIG. 15 facilitating producing strained nanosheet FETs using alternating layers of a phase change material including an RMG in the pFET region in accordance with one or more embodiments described herein.

FIG. 16 illustrates a semiconductor device 100 of FIG. 15 facilitating producing strained nanosheet FETs using alternating layers of a phase change material including an RMG 1602 in the pFET region 210 in accordance with one or more embodiments described herein. The block 1502 can remain over and protect the nFET region 212 during the formation of the RMG 1602. The block 1502 can be removed after the formation of the RMG 1602. The block 1502 can be removed with any suitable techniques. The RMG 1602 can comprise a high-k dielectric and a WFM formed by using, for example, CVD. To pattern the RMG 1602, a gate dielectric layer can be deposited on the surfaces of the openings 1504 and a gate conductor metal can be deposited onto the gate dielectric layer.

According to exemplary embodiments, the RMG 1602 can be formed wherein the gate dielectric layer can be a high-k dielectric and the gate conductor metal can be a metal or combination of metals. The gate dielectric layer can be any appropriate insulating material. A high-k dielectric material can be a material having a dielectric constant k that can be higher than that of silicon dioxide. Examples of high-k materials can include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k can further include dopants such as lanthanum and aluminum.

The gate conductor metal can be a WFM. The gate conductor metal can be any appropriate conductive material including, but is not limited to, metals such as tungsten, nickel, titanium, molybdenum, tantalum, copper, platinum, silver, gold, ruthenium, iridium, rhenium, rhodium, and alloys thereof, polysilicon, or a conducting metallic compound material such as tantalum nitride, titanium nitride, tungsten silicide, tungsten nitride, ruthenium oxide, cobalt silicide, or nickel silicide. The gate conductor metal can further include dopants that can be incorporated during or after deposition.

Figure 17:
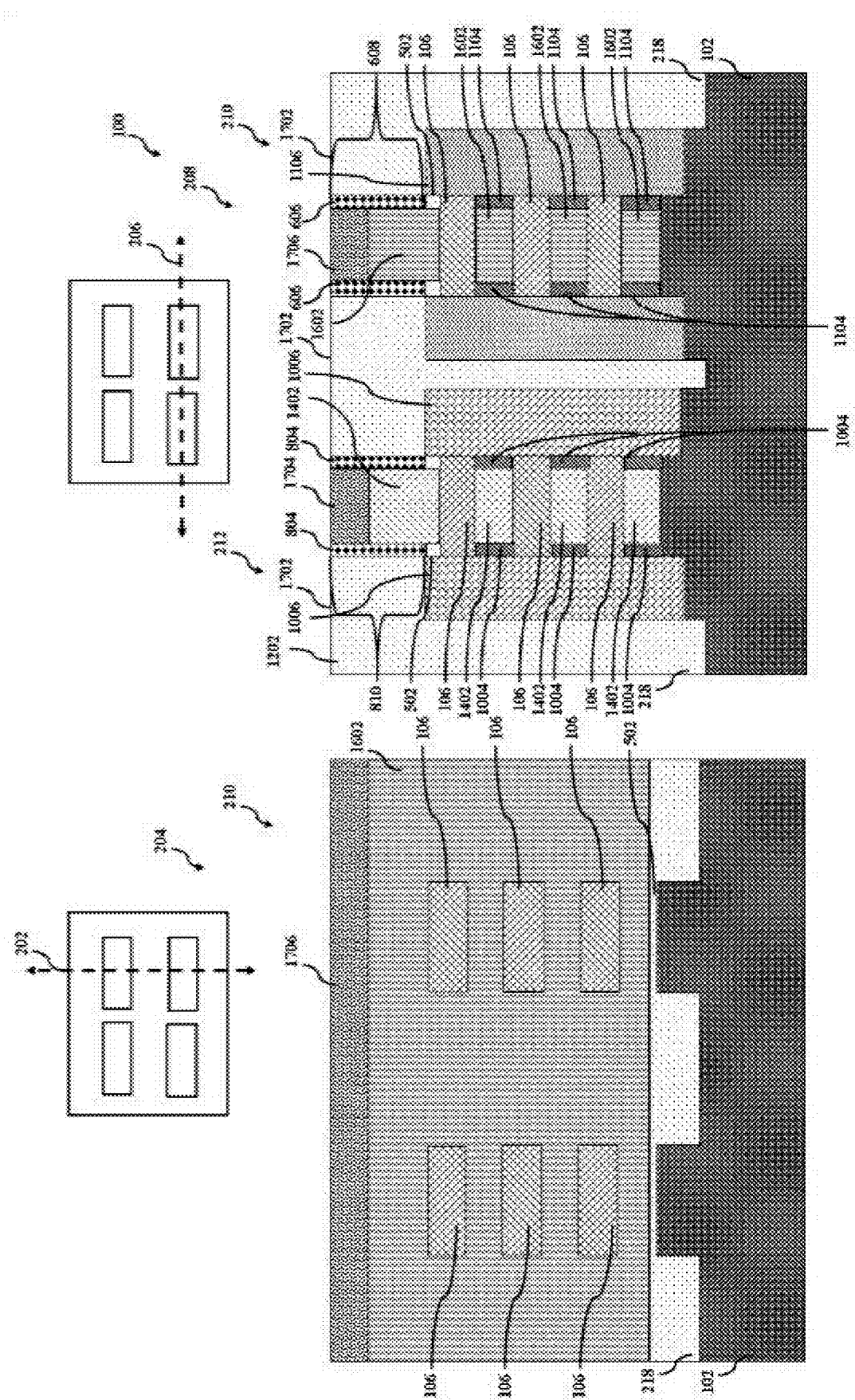
FIG. 17 illustrates a semiconductor device of FIG. 16 facilitating producing strained nanosheet FETs using alternating layers of a phase change material including gate caps formed in the RMGs in accordance with one or more embodiments described herein.

FIG. 17 illustrates a semiconductor device 100 of FIG. 16 facilitating producing strained nanosheet FETs using alternating layers of a phase change material including gate caps 1702 and 1704 formed in the RMGs 1402 and 1602 in accordance with one or more embodiments described herein. A directional etch back such as, for example, RIE can be used to etch back and form recesses in the RMGs 1402 and 1602. The RMGs 1402 and 1602 can be etched back to expose a surface 1702 of the dielectric fill 1202. Recesses or openings can be formed for a gate cap 1704 in the nFET region 212 and a gate cap 1706 in the pFET region 210. The gate caps 1704 and 1706 can be formed by using dielectric material such as, for example, silicon nitride to fill the openings in the RMGs 1402 and 1602. The gate cap 1704 can be formed by in the RMG 1402 and the gate cap 1706 can be formed in the RMG 1602. The gate caps 1704 and 1706 can be formed from silicon nitride and deposited using CVD. The gate caps 1704 and 1706 can be used to protect the RMGs 1402 and 1602 from downstream process damage.

Figure 18:
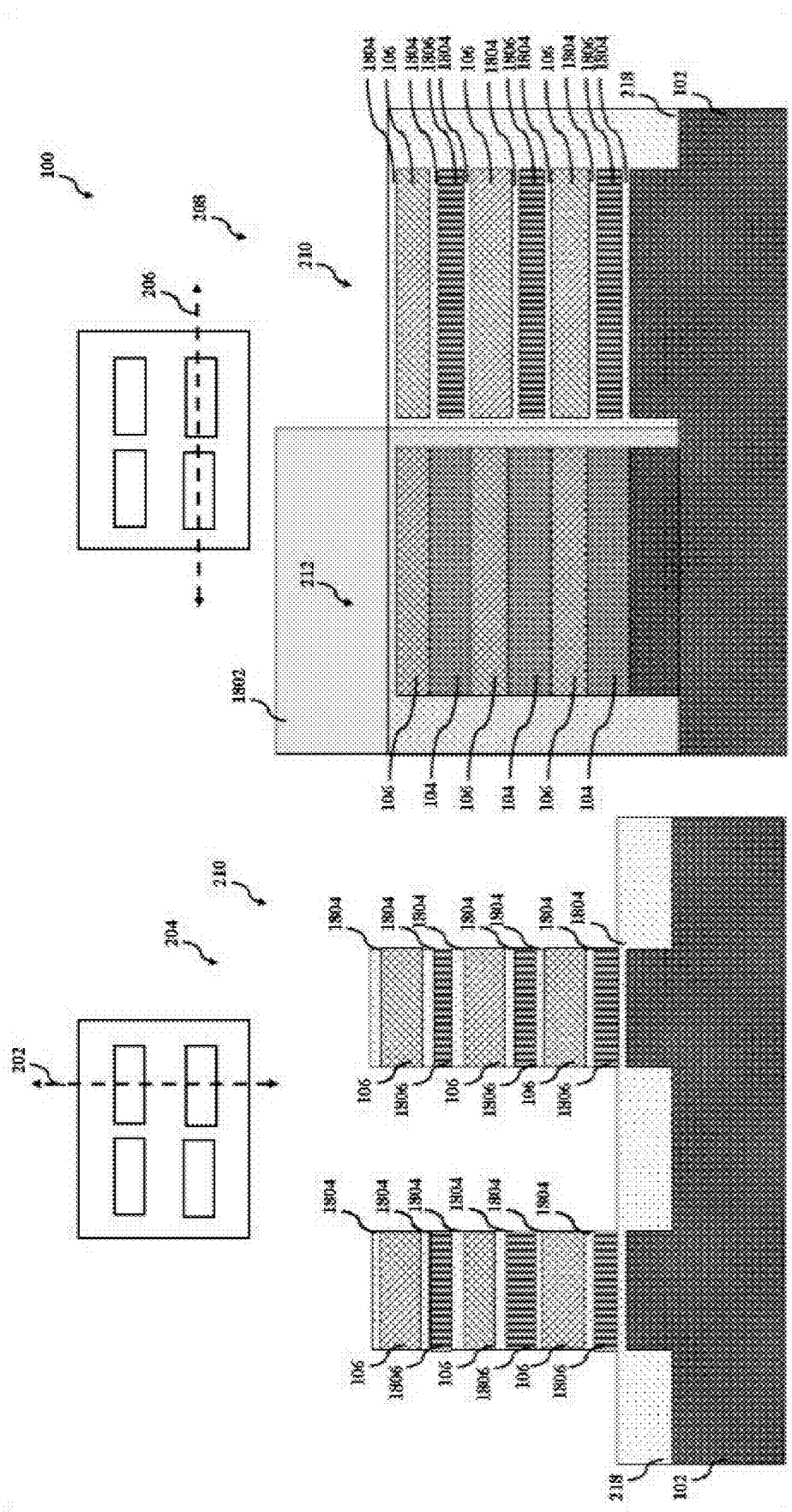
FIG. 18 illustrates a semiconductor device of FIG. 2 facilitating producing strained nanosheet FETs using alternating layers of a phase change material including replacement of the sacrificial channel material layer with the phase change material layer in accordance with one or more embodiments described herein.
Figure 19:
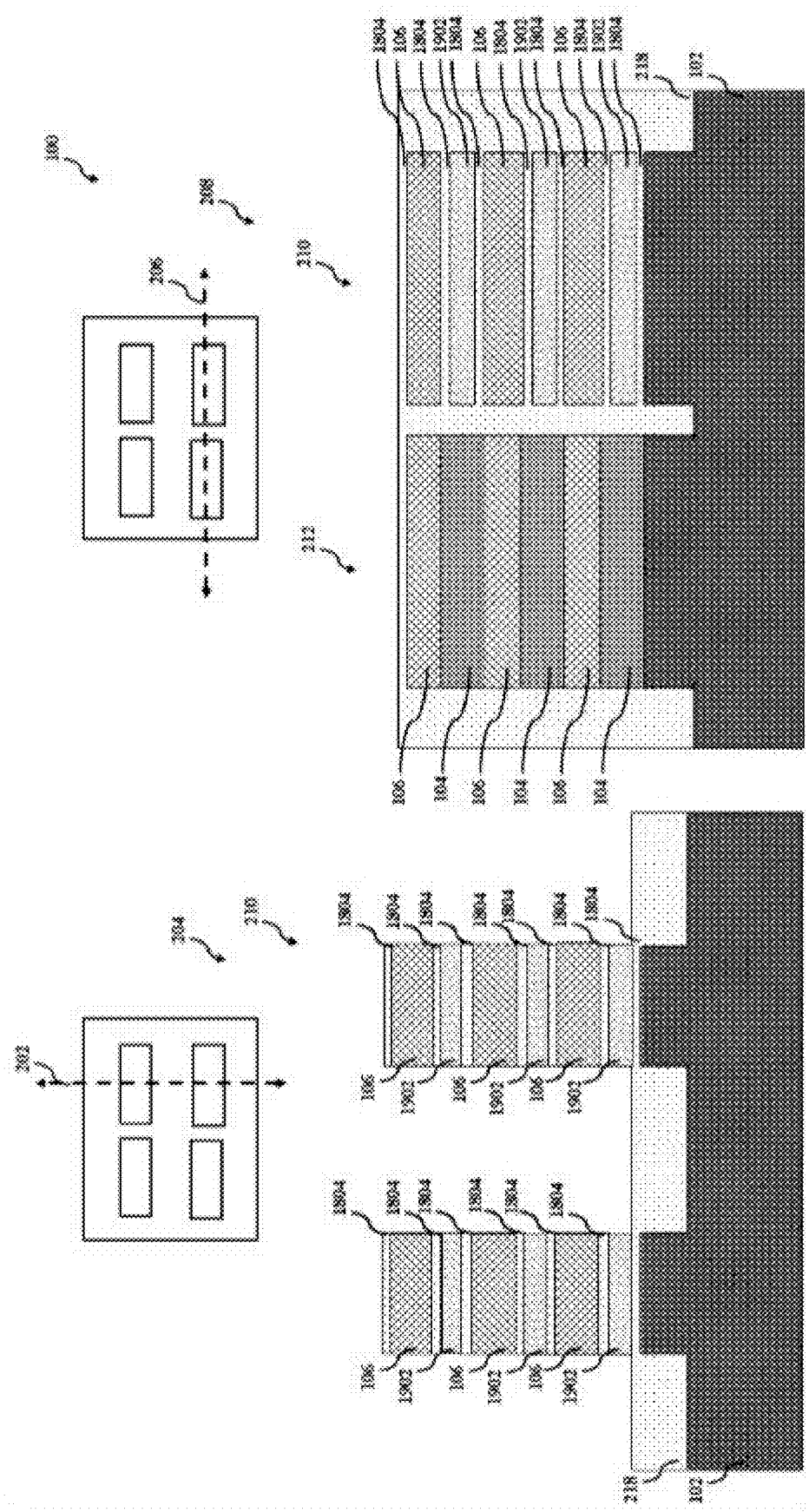
FIG. 19 illustrates a semiconductor device of FIG. 18 facilitating producing strained nanosheet FETs using alternating layers of a phase change material including transforming the phase change material to c-GST in accordance with one or more embodiments described herein.

FIGS. 1-17 illustrate embodiments having a sacrificial channel material (e.g., silicon germanium) replaced with a phase change material (e.g., GST) after a sacrificial gate (e.g., amorphous silicon) deposition. FIGS. 18 and 19 illustrate additional embodiments having a sacrificial channel material replaced with a phase change material before a sacrificial gate deposition. Repetitive description of like elements employed in other embodiments described herein is omitted for sake of brevity. It can be appreciated that the masking and patterning techniques illustrated in FIGS. 1-17 and FIGS. 18 and 19 can also be used to produce a tensile strain in the nFET region. As mentioned above, hydrogen doped silicon nitride can be used to produce a tensile strain in the nFET region. The hydrogen doped silicon nitride can be deposited using PECVD and a UV cure can be applied to produce a tensile strain in the stacked nanosheet channels of the nFET region.

FIG. 18 illustrates a semiconductor device 100 of FIG. 2 facilitating producing strained nanosheet FETs using alternating layers of a phase change material including replacement of the sacrificial channel material layer 104 with the phase change material layer 1806 in accordance with one or more embodiments described herein. A phase change material layer 1806 can be used to replace the sacrificial channel material 104 before a sacrificial gate deposition. As in FIG. 2, the fins 216 can be formed on the substrate 102 using hardmasks 214 and the dielectric fill 218 can be formed around the fins 216. A block 1802 can be formed to protect the nFET region 212 during the replacement of the sacrificial channel material layer 104 with the phase change material layer 1806. Similar to FIG. 4, the sacrificial channel material layer 104 in the pFET region 210 can be removed to form openings (not shown). Similar to FIG. 5, a dielectric layer 1804 can be used to coat a layer on the channel material layer 106, and the phase change material layer 1806 can be used to fill the openings. A directional etch can be used to etch the fins 216 such that in the cross-sectional view 204, the channel material layer 106, the phase change material layer 1804, and the dielectric layer 1804 align to one another.

FIG. 19 illustrates a semiconductor device 100 of FIG. 18 facilitating producing strained nanosheet FETs using alternating layers of a phase change material including transforming the phase change material layer 1806 to c-GST 1902 in accordance with one or more embodiments described herein. The block 1802 can be removed and the phase change material layer 1806 can be transformed to c-GST 1902 by an annealing process. Annealing >300° C. can transform the phase change material layer 1806 to the c-GST 1902. The transformation of the phase change material layer 1806 to c-GST 1902 can result in a volume reduction of ~6%, which can introduce a compressive strain in the channel material layer 106 in the pFET region 210.

Additional steps to produce strained nanosheet FETs are similar to those described above. Moreover, sacrificial gates can be formed on the fins 216 in the nFET region 212 and the pFET region 210. The fins 216 can be recessed to form source and drain recesses. Inner spacers can be formed in the fins 216 at the ends of the sacrificial channel material layer 104 and in the c-GST 1902. Source and drain epitaxial growths can be formed in the source and drain recesses. RMGs can replace the sacrificial gates. The RMGs can be recessed and gate caps can be formed in the recesses.

Figure 20:
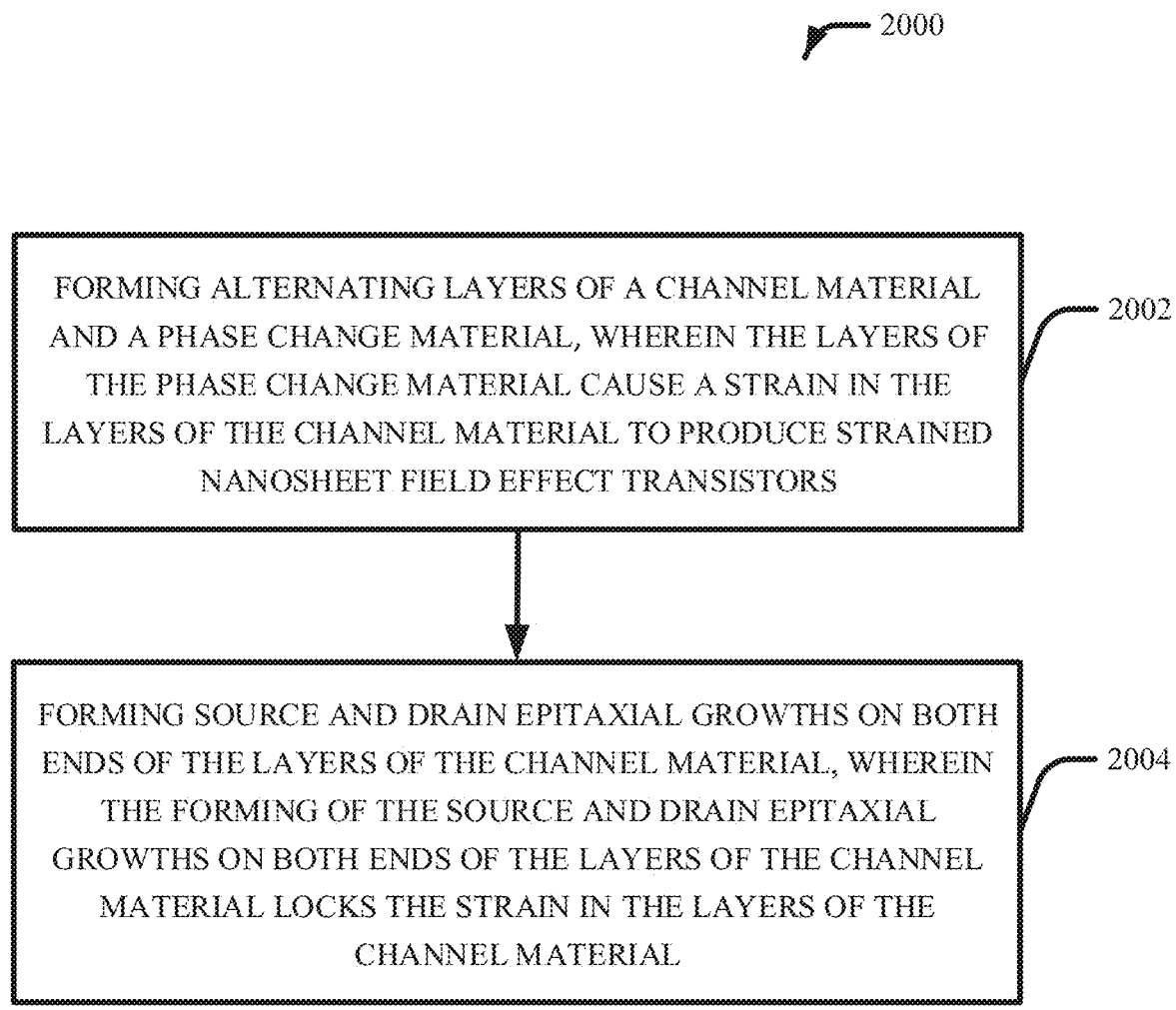
FIG. 20 illustrates method 2000 facilitating producing strained nanosheet FETs using a phase change material in accordance with one or more embodiments described herein.

FIG. 20 illustrates method 2000 facilitating producing strained nanosheet FETs using a phase change material in accordance with one or more embodiments described herein. At 2002, the method 2000 can comprise forming alternating layers of a channel material (e.g., the channel material layer 106) and a phase change material (e.g., the phase change material layer 504), wherein the layers of the phase change material cause a strain in the layers of the channel material to produce strained nanosheet FET. At 2004, the method 2000 can comprise forming source and drain epitaxial growths (e.g., the source and drain 1106 in the pFET region 210 or the source and drain 1006 in the nFET region 212) on both ends of the layers of the channel material, wherein the forming of the source and drain epitaxial growths on both ends of the layers of the channel material locks the strain in the layers of the channel material. The strain posed to the channel (e.g., a channel material layer) by a phase change material (e.g., a phase change material layer) can be compressive for a pFET to enhance hole mobility and thus pFET performances. Conversely, the strain posed to the channel by a phase change material can be tensile for an nFET to enhance electron mobility and thus nFET performances.

The descriptions of the various embodiments have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

In addition, the term "or" is intended to mean an inclusive "or" rather than an exclusive "or." That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. Moreover, articles "a" and "an" as used in the subject specification and annexed drawings should generally be construed to mean "one or more" unless specified otherwise or clear from context to be directed to a singular form. As used herein, the terms "example" and/or "exemplary" are utilized to mean serving as an example, instance, or illustration. For the avoidance of doubt, the subject matter disclosed herein is not limited by such examples. In addition, any aspect or design described herein as an "example" and/or "exemplary" is not necessarily to be construed as preferred or advantageous over other aspects or designs, nor is it meant to preclude equivalent exemplary structures and techniques known to those of ordinary skill in the art.

What is claimed is:

1. A semiconductor device, comprising:
   alternating layers of a channel material and a phase change material, wherein the layers of the phase change material cause a strain in the layers of the channel material to produce strained nanosheet field effect transistors.

2. The semiconductor device of claim 1, wherein the layers of the phase change material are layers that replaced layers of sacrificial channel material to introduce the strain in the layers of the channel material.

3. The semiconductor device of claim 2, wherein the sacrificial channel material comprises silicon germanium, and wherein the phase change material comprises germanium antimony telluride.

4. The semiconductor device of claim 3, wherein the germanium antimony telluride crystallizes into a crystalline germanium antimony telluride based on annealing above 300 degrees Celsius.

5. The semiconductor device of claim 4, wherein a volume of the crystalline germanium antimony telluride is reduced up to six percent relative to an initial volume of the germanium antimony telluride to cause the strain in the layers of the channel material.

6. The semiconductor device of claim 1, wherein the channel material comprises silicon, and wherein a channel comprising the channel material is a silicon channel.

7. The semiconductor device of claim 1, further comprising:
   source and drain epitaxial growths on both ends of the layers of the channel material, wherein the source and drain epitaxial growths lock the strain in the layers of the channel material.

8. The semiconductor device of claim 1, further comprising:
   a p-type field effect transistor (pFET) coupled to the alternating layers of the channel material and the phase change material, wherein the strain in the layers of the channel material comprises a compressive strain.

9. A method, comprising:
   forming alternating layers of a channel material and a phase change material, wherein the layers of the phase change material cause a strain in the layers of the channel material to produce strained nanosheet field effect transistors.

10. The method of claim 9, further comprising:
    prior to the forming alternating layers of the channel material and the phase change material, forming alternating layers of channel material and sacrificial channel material; and
    replacing the layers of sacrificial channel material with the layers of phase change material to form the alternating layers of channel material and the phase change material.

11. The method of claim 10, wherein the sacrificial channel material comprises silicon germanium, and wherein the phase change material comprises germanium antimony telluride.

12. The method of claim 11, further comprising:
    crystallizing the germanium antimony telluride of the phase change material into a crystalline germanium antimony telluride thereby reducing a volume of the crystalline germanium antimony telluride by at least 6 percent relative to an initial volume of the germanium antimony telluride to cause the strain in the layers of the channel material, wherein the crystallizing is based on annealing the germanium antimony telluride above 300 degrees Celsius.

13. The method of claim 10, further comprising:
    providing a sacrificial gate deposition, wherein the providing the sacrificial gate deposition is performed:
       over the alternating layers of the channel material and the sacrificial channel material and prior to the replacing; or
       over the alternating layers of the channel material and the phase change material and after the replacing.

14. The method of claim 9, wherein the channel material comprises silicon, and wherein a channel comprising the channel material is a silicon channel.

15. The method of claim 9, further comprising:
    forming source and drain epitaxial growths on both ends of the layers of the channel material, wherein the forming of the source and drain epitaxial growths on both ends of the layers of the channel material locks the strain in the layers of the channel material.

16. The method of claim 15, further comprising:
    removing the layers of the phase change material, wherein the source and drain epitaxial growths maintain the strain in the layers of the channel material after the removing the layers of the phase change material.

17. The method of claim 9, further comprising:
    forming a p-type field effect transistor (pFET) coupled to the alternating layers of the channel material and the phase change material, wherein the strain comprises a compressive strain.

18. A semiconductor device, comprising:
    alternating layers of a channel material and a phase change material, wherein the layers of the phase change material cause a strain in the layers of the channel material to produce strained nanosheet field effect transistors, and wherein the phase change material comprises germanium antimony telluride.

19. The semiconductor device of claim 18, wherein the germanium antimony telluride crystallizes into a crystalline germanium antimony telluride based on annealing above 300 degrees Celsius and a volume of the crystalline germanium antimony telluride is reduced up to six percent relative to an initial volume the germanium antimony telluride to cause the strain in the layers of the channel material.

20. The semiconductor device of claim 18, further comprising:
    source and drain epitaxial growths on both ends of the layers of the channel material that lock the strain in the layers of the channel material.

* * * * *